United States Patent
Zalevsky et al.

(10) Patent No.: US 8,009,358 B2
(45) Date of Patent: Aug. 30, 2011

(54) OPTICAL SYSTEM AND METHOD FOR USE IN PROJECTION SYSTEMS

(75) Inventors: Zeev Zalevsky, Rosh HaAyin (IL); Yuval Kapellner, Bat Yam (IL); Izhar Eyal, Bat Yam (IL); Golan Manor, Tel Aviv (IL)

(73) Assignee: Explay Ltd., Hertzliya (IL)

( * ) Notice: Subject to any disclaimer, the term of this patent is extended or adjusted under 35 U.S.C. 154(b) by 964 days.

(21) Appl. No.: 10/575,565

(22) PCT Filed: Oct. 17, 2004

(86) PCT No.: PCT/IL2004/000951
§ 371 (c)(1),
(2), (4) Date: May 7, 2007

(87) PCT Pub. No.: WO2005/036211
PCT Pub. Date: Apr. 21, 2005

(65) Prior Publication Data
US 2007/0273957 A1    Nov. 29, 2007

Related U.S. Application Data

(60) Provisional application No. 60/514,734, filed on Oct. 17, 2003.

(51) Int. Cl.
*G02B 27/10* (2006.01)
(52) U.S. Cl. ........................................ 359/618; 359/619
(58) Field of Classification Search ............. 359/618
See application file for complete search history.

(56) References Cited

U.S. PATENT DOCUMENTS

| | | | |
|---|---|---|---|
| 4,701,005 A * | 10/1987 | Noguchi | 359/17 |
| 4,995,693 A | 2/1991 | Wilson | |
| 5,195,103 A | 3/1993 | Hinton et al. | |
| 5,682,265 A | 10/1997 | Farn et al. | |
| 6,542,531 B2 | 4/2003 | Sirbu et al. | |
| 6,546,029 B2 | 4/2003 | Sirbu et al. | |
| 6,563,567 B1 | 5/2003 | Komatsuda et al. | |
| 2002/0191913 A1 | 12/2002 | Hocker et al. | |
| 2006/0279662 A1 * | 12/2006 | Kapellner et al. | 348/744 |

FOREIGN PATENT DOCUMENTS

| | | |
|---|---|---|
| WO | 03010588 A | 7/2001 |
| WO | 03029768 A | 9/2002 |

OTHER PUBLICATIONS

International Search report issued by the European Patent Office on Jul. 22, 2009, in Application No. 04770619.7.

(Continued)

*Primary Examiner* — Scott J Sugarman
*Assistant Examiner* — James C Jones
(74) *Attorney, Agent, or Firm* — Browdy and Neimark, PLLC

(57) ABSTRACT

An optical system and method are presented to produce a desired illuminating light pattern. The system comprises a light source system configured and operable to produce structured light in the form of a plurality of spatially separated light beams; and a beam shaping arrangement. The beam shaping arrangement is configured as a diffractive optical unit configured and operable to carry out at least one of the following: (i) combining an array of the spatially separated light beams into a single light beam thereby significantly increasing intensity of the illuminating light; (ii) affecting intensity profile of the light beam to provide the illuminating light of a substantially rectangular uniform intensity profile.

80 Claims, 16 Drawing Sheets

OTHER PUBLICATIONS

Roberts, N.C. "Beam Shaping by Holographic Filters," Applied Optics, OSA, Optical Society of America, Washington D.C., 28(1): 31-32 (Jan. 1, 1989).

Lohmann, A. W; "Array illuminators and complexity theory"; Optics Communications 89 (1992) 167-172.

Turunent, J., et al; "Optimisation and fabrication of granting beamsplitters"; J. Phys D; Appl Phys 21 (1988) S102-S105.

* cited by examiner

Laser Array Beam Profile

Uniform Beam Profile after TopHatLet

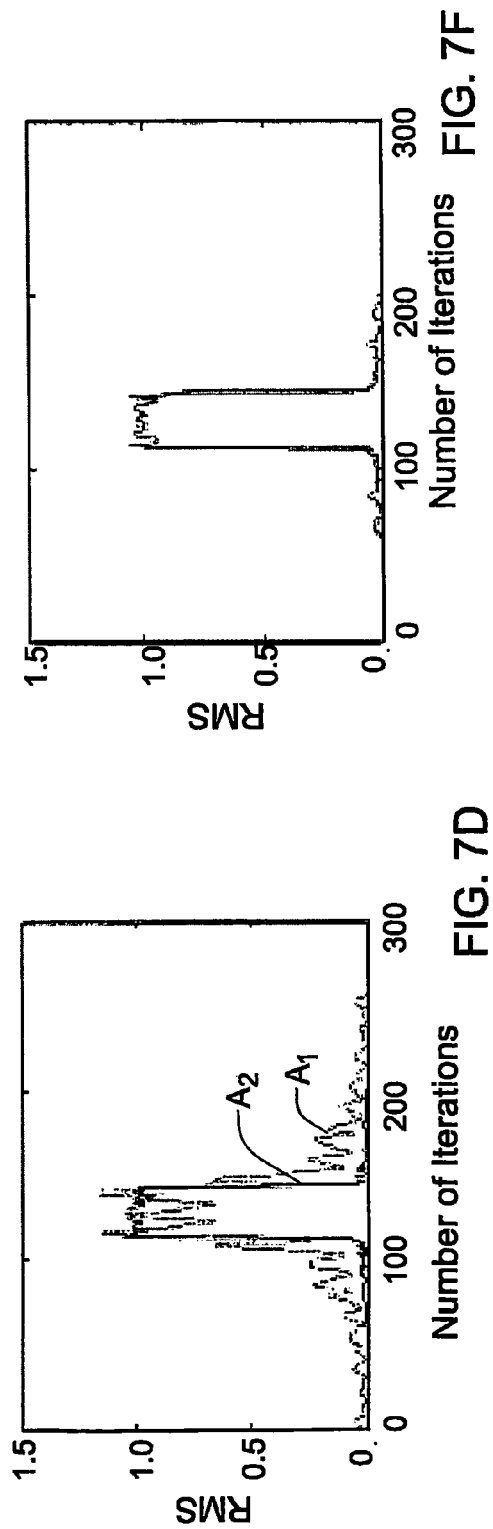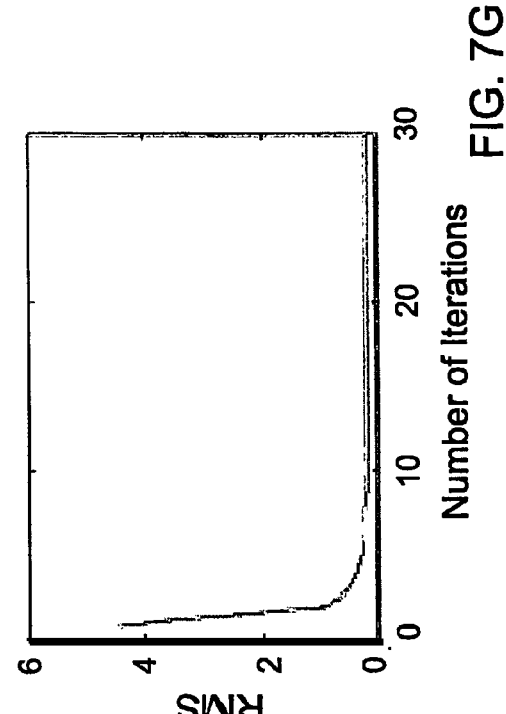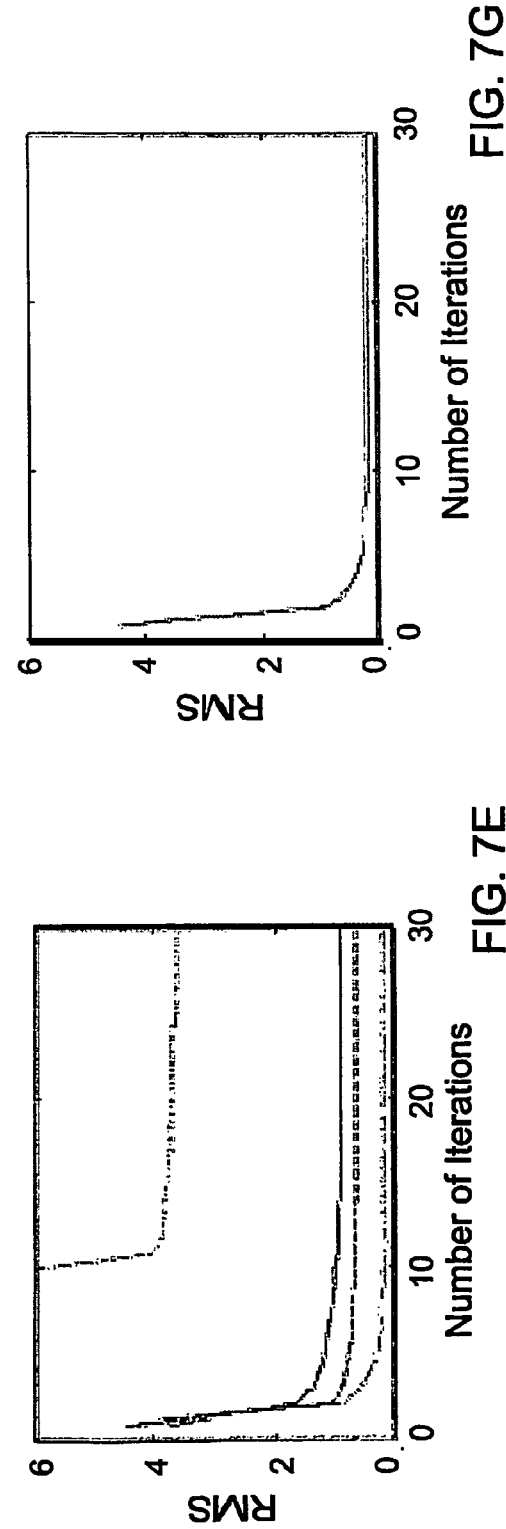

OPTICAL SYSTEM AND METHOD FOR USE IN PROJECTION SYSTEMS

FIELD OF THE INVENTION

This invention is generally in the field of optical systems and methods, and relates to an optimized light source and beam shaping system and method suitable for use in projections systems.

BACKGROUND OF THE INVENTION

As light source technology evolves, light emitting diodes (LEDs) and lasers are being used in ever growing applications. These types of light sources, due to their increased optical efficiency and low power consumption are starting to replace standard light sources such as halogen, florescent, etc.

The problem still keeping LEDs and lasers from becoming key light sources in the illumination/multimedia industry is the inability to provide high optical power with relatively low power consumption, as well as inability to provide small physical size with overall low price of the light source, which is also due to the low efficiency of today's projection system that enforces high power sources.

A laser light source composed of a single laser diode is too expensive for light source applications due to the method of fabrication and the high power out put required.

A Vertical Cavity Surface Emitting Laser (VCSEL) has been developed. VCSEL is a semiconductor microlaser offering significant advantages over edge-emitting lasers (EEL) currently used in the majority of fiber optic communications devices. EELs emit coherent light or infrared energy parallel to the boundaries between semiconductor layers. VCSEL emits its coherent energy perpendicular to the boundaries between the layers. VCSELs have high performance and low cost advantages. The VCSELs based structure can be diced directly from the wafer in two-dimensional array configuration. VCSEL operates with low threshold currents thus enabling high-density arrays. surface-normal emission of VCSEL and nearly identical to the photo detector geometry gives easy alignment and packaging; VCSELs provide circular and low divergence output beams thus eliminating the need for corrective optics. VCSEL has lower temperature-sensitivity compared to edge-emitting laser diodes, and high transmission speed with low power consumption.

A vertical cavity surface emitting laser and a method of fabrication thereof is disclosed for example in U.S. Pat. No. 6,542,531. This electrically pumped VCSEL comprises an active cavity material sandwiched between top and bottom DBR stacks. The top DBR has at least one n-semiconductor layer. The device defines an aperture region between the structured surface of the active cavity material and the n-semiconductor layer of the top DBR stack. The structured surface is formed by a top surface of a mesa that includes at least the upper n++ layer of a p++/n++ tunnel junction and the surface of a p-type layer outside the mesa. The structured surface is fused to the surface of the n-semiconductor layer of the DBR stack due to the deformation of these surfaces, thereby creating an air gap in the vicinity of the mesa between the fused surfaces. The active region is defined by the current aperture which includes the mesa surrounded by the air gap, thereby allowing for restricting an electrical current flow to the active region, while the air gap provides for the lateral variation of the index of refraction in the VCSEL.

U.S. Pat. No. 6,546,029 discloses a micro-electromechanically tunable vertical cavity photonic device and a method of fabrication thereof. A tunable Fabry-Perot vertical cavity photonic device comprises top and bottom semiconductor DBR stacks and a tunable air-gap cavity therebetween. The air-gap cavity is formed within a recess in a spacer above the bottom DBR stack. The top DBR stack is carried by a supporting structure in a region thereof located above a central region of the recess, while a region of the supporting structure above the recess and outside the DBR stack presents a membrane deflectable by the application of a tuning voltage to the device contacts.

Nowadays most of the VCSELs work within the non-visible range, mostly for purposes of telecommunication although some promise has been made in demonstrating visible red VCSELS.

New generation of FP lasers with internal 45 degrees reflecting mirror has also been fabricated to enable the FP laser to be Surface-Emitting.

SUMMARY OF THE INVENTION

There is a need in the art for high-efficiency and preferably small-size optical systems for use in various applications.

The present invention provides a novel approach for the light source aspect and the light propagation aspect (optical path) to dramatically optimize the optical system performance (e.g. projection systems), costs and size; as well as a low cost fabrication method for optical elements with total control on the light beam properties.

The light source system of the present invention is configured for generating structure light, and preferably includes an array of micro light sources, which are operable in an optimized manner (depending on the specific application) to improve the light source system performance. The light source system also includes a light collecting/directing unit (e.g., a collection lens). The micro light sources are preferably carried by a common substrate, and the collection lens is located above the light sources plane. The micro light sources may be operated using a sequencing mechanism controlled by a control unit, which may be integrated within the light source system (internal logic unit) or a stand alone unit (external unit) connectable to the light source system. Such a logic unit is configured and operable to control the on and off state of the light source element (laser) in such a manner as to provide maximum distance between two subsequently on light source elements, and minimize heating and maximize heat dissipation.

Preferably, the light source system of the present invention utilizes a plurality of SE lasers such as VCSELs, or tightly packaged plurality of EE lasers. VCSELs may be used as an actual light source and not as a pumping source. Alternatively, in order to operate in a visible spectral range (for example green light or blue light) using VCSELs emitting light outside this spectral range, VCSELs are used together with a non-linear optical medium (e.g., crystal or polymer), either directly doubling the VCSEL lasing frequency or coupled with lasing crystals using the VCSELs as a pumping source and then doubling the emitted frequency from the laser crystal into the visible range.

Additionally, the present invention provides a novel beam shaping technique. Generally, the beam shaping is aimed at providing, from certain light input (a single beam or a plurality of beams), light output of a desired cross section (similarly, a multiple-beam output or a single-beam output). The use of beam shaping is essential when operating with a plurality of micro light sources (e.g., VCSELs) as an optimized light source. The plurality of micro light sources generate structured light, namely, a plurality of spaced-apart light beams, which when combined, on the one hand provides an output beam of higher intensity, and on the other hand has to be appropriately shaped. The beam shaping technique of the present invention utilizes a diffractive optical assembly, using a tophat or array of tophat elements; Dammann gratings; an inverse Dammann grating; multi-pixel diffractive optical phase mask (filter); and/or a diffractive optical element utilizing a fractal based approach.

Thus, according to one broad aspect of the present invention, there is provided an optical system configured to provide a desired illuminating light pattern, the system comprising a light source system configured and operable to produce structured light in the form of a plurality of spatially separated light beams; and a beam shaping arrangement; the beam shaping arrangement being configured as a diffractive optical unit configured and operable to carry out at least one of the following: (i) combining an array of the spatially separated light beams into a single light beam thereby significantly increasing intensity of the illuminating light; (ii) affecting intensity profile of the light beam to provide the illuminating light of a substantially rectangular uniform intensity profile.

The light source system may include a plurality (array) of light source elements each producing the corresponding one of the light beams of structure light. Alternatively or additionally, the light source system may include at least one light source generating a single light beam, and a light splitting unit for splitting the light beam into a plurality of the spatially separated light beams.

The light splitting unit may include a multi-pixel diffractive optical phase mask configured to produce from a light beam an array of spatially separated light beams. The multi-pixel diffractive optical phase mask may be configured to define within each of the multiple pixels an array of sub-pixels, thereby producing from each of the spatially separated light beams a further plurality of spatially separated light beams (fractal approach). The light splitting unit may include a Dammann grating assembly configured to produce from a light beam a plurality of spatially separated light beams. The light splitting unit may include an array of (at least two) Dammann grating assemblies arranged in a cascaded manner, such that each light beam output from one Dammann grating assembly is directed through a successive Dammann grating assembly, thereby multiplying a number of the light beams produced by the first Dammann grating assembly.

The optical system preferably includes a focusing optics including a single lens arrangement in optical paths of all the light beams to direct them along an optical axis of the lens, or including an array of lenses each in an optical path of the corresponding one of the light beams.

The light source system may include one or more pumping light source and one or more non-linear medium to be operated by light generated by the pumping source, either directly or via additional laser crystal. The pumping source may include an array of light source elements, for example VCSELs. The light source system may include at least one light emitting diode (LED), and or at least one EE laser, and/or at least one VCSEL.

The beam shaping arrangement may include an inverse Dammann grating assembly to produce from the structured light a single high-intensity output beam. Alternatively or additionally, the beam shaping arrangement may include at least one tophat element assembly, which may be in the form of an array of the tophat elements each in the optical path of the corresponding one of the plurality of light beams. The tophat element assembly is configured to affect the intensity profile of the corresponding light beam to produce therefrom the output beam of the substantially rectangular intensity profile corresponding to the geometry of an imaging surface (e.g., SLM pixel or the entire pixel arrangement), by either generating a mosaic of beams on the imaging surface, or by each beam covering substantially the entire surface and summing their intensity. The inverse Dammann assembly may be used together with the tophat assembly, for example the tophat assembly being accommodated at output of the inverse Dammann grating assembly.

The inverse Dammann grating may be used with the light source system of the kind utilizing pumping a non-linear optical medium. In this case, the inverse Dammann grating is accommodated upstream of the non-linear medium with respect to a direction of light propagation through the optical system. Additionally, a tophat element assembly may be accommodated in an optical path of the combined light beam produced by the inverse Dammann grating. The tophat element assembly may be used with the light source system of the kind utilizing pumping a non-linear optical medium, wherein the tophat element assembly is accommodated directly at the output of the non-linear medium.

The optical system preferably includes a control unit associated with the light source system. The control unit is pre-programmed to carry out a sequencing mechanism to thereby sequentially actuate a plurality of light source elements in accordance with a predetermined pattern. The pattern may be such that at any given time only one light source element is operative, and the entire light source system is seen to a human eye as constantly operative for a required operation time, thereby reducing over heating in a single area defined by the light source system. The pattern may be such that at any given moment of time the most distant light source element is operative relative to the light source element that was operative before it. The pattern may be such that at any given time only one group of light source elements is operative.

The light source system may be configured to define at least two spatially separated optical paths associated with at least two light sources, respectively, for example operating in different wavelength ranges. At least one of the light sources may be of the kind utilizing pumping of a non-linear medium, and at least one other light source is an active light source. In this case, the beam shaping arrangement preferably includes a tophat element assembly accommodated in one of the optical paths to allow passage of the spatially separated light beams therethrough and thereby produce output light beams of a substantially rectangular intensity profile; and a light combining unit for combining light from the at least two optical paths to propagate along a common optical path. Such a system may be used for illuminating the pixel arrangement of an SLM. The spatially separated light beams are arranged in an array corresponding to the pixel array arrangement of the SLM. The tophat element assembly may include an array of tophat elements each associated with a corresponding one of the light beams. The beam shaping arrangement may also include at least one light splitting unit for splitting light emerging from the non-linear medium into a predetermined array of spatially separated light beams.

The light source system may include first and second VCSEL arrays operating with different wavelengths, respectively, associated with the first and second non-linear medium; and the laser die array operating with a third different wavelength. In this case, the VCSEL arrays operate in a non-visible spectral range, and the crystals are used to produce two different colors, respectively, of a visible spectral range.

According to another broad aspect of the present invention, there is provided an optical system configured to provide a desired illuminating light pattern, the system comprising a light source system configured and operable to produce structured light in the form of a plurality of spatially separated light beams; and a beam shaping arrangement comprising; the beam shaping arrangement comprising an inverse Dammann grating assembly configured and operable to combine said plurality thereby significantly increasing intensity of the illuminating light.

According to yet another broad aspect of the present invention, there is provided an optical system configured to provide a desired illuminating light pattern, the system comprising a light source system configured and operable to produce structured light in the form of a plurality of spatially separated light beams; and an array of tophat elements each configured and operable for affecting the intensity profile of light passing therethrough to produce therefrom a light beam of the substantially rectangular uniform intensity profile.

According to yet another broad aspect of the present invention, there is provided an optical system configured to provide a desired illuminating light pattern, the system comprising a light source system configured and operable to produce at least one light beam; and a multi-pixel diffractive optical phase mask arrangement configured to produce from said at least one light beam structured light formed by a predetermined array of spatially separated light beams of substantially equal intensity value and profile, the multi-pixel diffractive optical phase mask arrangement being configured to define a first array of the pixels, each of said pixels being patterned to define a second array of sub-pixels, said structured light being in the form of the spatially separated light beams arranged in accordance with said second array of pixels.

According to yet another aspect of the invention, there is provided an optical system configured to provide a desired illuminating light pattern, the system comprising a light source system configured and operable to produce at least one light beam; and a multi-pixel diffractive optical phase mask arrangement configured to produce from said at least one light beam structured light formed by a predetermined array of spatially separated light beams of substantially equal intensity value and profile, the multi-pixel diffractive optical phase mask arrangement comprising at least first and second multi-pixel diffractive optical phase masks arranged in a cascaded manner such that the first mask splits the light beam into a first array of spatially separated light beams, and the second mask splits each of said spatially separated light beams into a second array of spatially separated light beams.

According to yet another broad aspect of the present invention, there is provided an optical system for use in patterning a surface, the optical system comprising a light source system configured and operable to produce at least one light beam; and a multi-pixel diffractive optical phase mask arrangement configured to produce from said at least one light beam structured light formed by a predetermined array of spatially separated light beams of substantially equal intensity value and profile.

According to yet another broad aspect of the present invention, there is provided a light source system comprising an array of light source elements; and a control unit configured and operable to carry out a sequencing mechanism to sequentially actuate the light source elements in accordance with a predetermined pattern.

According to yet another broad aspect of the present invention, there is provided an optical system for use in scanning an image, the system comprising at least two light sources producing light of different wavelengths propagating along at least two optical paths, respectively, at least one of said at least two light sources being configured to produce structured light in form of an array of spatially separated light beams; a light combining arrangement for combining said at least two optical path into an output optical path; and a mechanical scanner accommodated in said output optical path.

According to yet another aspect of the invention, there is provided an optical system for use in scanning an image, the system comprising at least two individually addressable light sources producing light of different wavelengths propagating along at least two optical paths, respectively, at least one of said at least two light sources being configured to produce structured light in form of an array of spatially separated light beams each of a substantially rectangular uniform intensity profile; a light combining arrangement for combining said at least two optical path into an output optical path; and a mechanical scanner accommodated in said output optical path.

The present invention also provides a method for producing illuminating light of a desired pattern, the method comprising producing structured light in the form of a plurality of spatially separated light beams; and applying beam shaping to the structure light, said beam shaping comprising passing the structured light through a diffractive optical unit configured and operable to carry out at least one of the following: (i) combining multiple light beams into a single light beam thereby significantly increasing intensity of the illuminating light; (ii) affecting the intensity profile of input light to provide the illuminating light in the form of an array of light beams of a substantially rectangular uniform intensity profile.

According to yet another broad aspect of the present invention, there is provided a method for use in patterning a surface to produce a lenslet array, the method comprising producing at least one light beam; and passing said at least one light beam through a multi-pixel diffractive optical phase mask configured to produce from said at least one light beam structured light formed by a predetermined array of spatially separated light beams of substantially equal intensity value and Gaussian intensity profile.

According to yet another broad aspect of the present invention, there is provided a method for use in scanning an image, the method comprising: producing at least first and second light portions of different wavelengths propagating along at least two optical paths, respectively, at least one of the light portions being in the form of an array of spatially separated light beams corresponding to an array of image pixels; combining said at least two optical paths into a single output optical path and direct the array of light beams along said single output optical path to a mechanical scanner.

The technique of the present invention provides for delivering unified brightness over the projected image since each pixel is individually lit and the spread of brightness across the image is 100% unified. Using the beam shaping arrangement along with the light source system for example in projection displays allows reducing the physical size of SLM tremendously and opens up vast variety of new applications for display projection technology.

The use of mixed sources combination (coherent and non coherent, polarized and non polarized), comprising different types of illumination sources (VCSELs, LEDS, laser dies), along with the beam shaping arrangement (Dammann, inverse Dammann, Dammann and lenslet arrangement, multi-pixel diffractive optical phase mask, fractal beam shaping) can improve and optimize projection systems and can be used as an illumination system for other applications (for example: lenslet fabrication) with significant improvement over the state of the art.

The combination of several light sources in a single medium, along with fast pulse mode drive operation to obtain lower consumption, higher output optical intensity and speckle reduction, with sets of light groups (laser die arrays, LED die, VCSEL arrays) and a sequencing mechanism into a single light module is a significant improvement over the state of the art.

BRIEF DESCRIPTION OF THE DRAWINGS

In order to understand the invention and to see how it may be carried out in practice, preferred embodiments will now be described, by way of non-limiting examples only, with reference to the accompanying drawings, in which:

FIGS. 2A to 2C more specifically illustrate the possible implementations of the light source system of FIG. 1, wherein FIG. 2A shows a multiple micro light sources' arrangement, and FIGS. 2B and 2C show two examples, respectively, of implementing the sequencing mechanism;

FIGS. 7A to 7G illustrate the principles of designing a diffractive optical unit (beam shaping arrangement) to be used in the present invention, wherein FIG. 7A shows a general optical set up for achieving beam shaping; FIG. 7B shows some steps of an iterative algorithm used; FIG. 7C shows the input field distribution (Gaussian field) on the diffractive optical element and the constraint output shape (rectangular), and FIGS. 7D-7G shows the simulation results;

FIGS. 9A to 9C illustrate the principles of designing Dammann grating to be used in the present invention, wherein FIG. 9A shows an optical setup, FIG. 9B shows the grating transparency function in one dimension, and FIG. 9C shows the output of a Dammann grating with one transition point;

FIG. 10A to 10F illustrate the principles of using the setup of FIG. 8 to transform an array of coherent point sources into a wide light source, wherein FIG. 10A shows an input containing a matrix of nine point sources (in one dimension), FIGS. 10B and 10C show the light intensity calculated in the output plane in, respectively, two dimensions and one dimension, FIG. 10D shows a one-dimensional Fourier transform of the light intensity in the output plane, FIG. 10E shows the light intensity after free space propagation (FSP) a distance of one focal length from the focal plane of a collection lens, and FIG. 10F illustrates the same light intensity in one-dimension after the FSP;

DETAILED DESCRIPTION OF THE INVENTION

Figure 1:
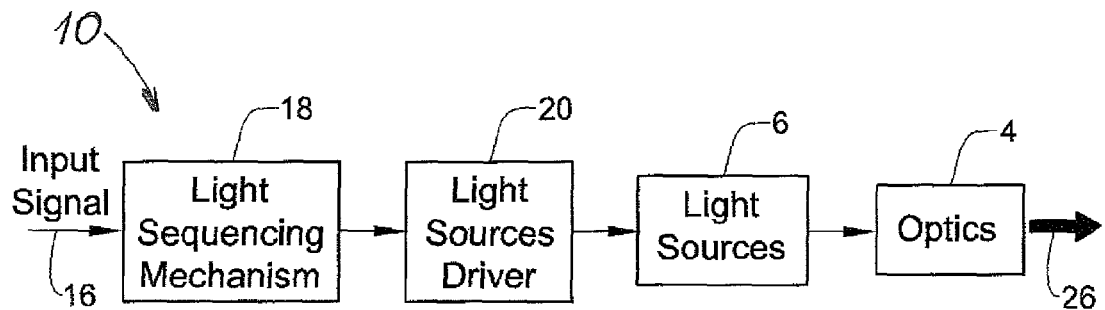
FIG. 1 is a block diagram of a light source system of the present invention operable by a sequencing mechanism.

Referring to FIG. 1, there is illustrated, by way of a block diagram, a light source system 10 of the present invention. The system 10 includes an arrangement of micro light sources 6; a focusing optics (light collecting/directing optics) 4; a light source driver assembly 20; and a processor preprogrammed for carrying out a light sequencing mechanism 18.

Figures 2A, 2B, 2C:
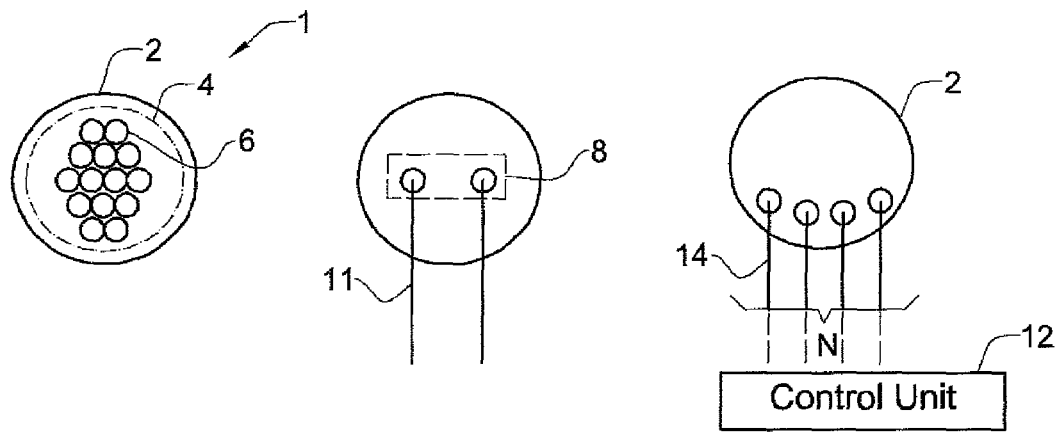

FIGS. 2A to 2C more specifically illustrate the possible implementations of the light source system of FIG. 1.

FIG. 2A shows a top view of a light source module 1 formed by a plurality of N micro light sources 6 all carried by a common substrate 2, and the light collecting/directing optics 4 located over the plurality of micro light sources 6. In the present example, the optics 4 includes a single collection lens for collecting light generated by all the micro light sources 6 and directing the collected light outwards in a parallel manner relatively unified. It should be noted that additional optics could be added upstream and/or downstream of the collection lens, for example a beam shaping arrangement, as will be described further below. FIGS. 2B and 2C schematically illustrate two examples, respectively, for implementing the sequencing mechanism in the micro light sources. Each of these figures shows a rear view of the light source module 1.

In the example of FIG. 2B, the light source module 1 utilizes an internal control unit (electronic circuit) 8 that incorporates the light sequencing mechanism and the light source driver (18 and 20 in FIG. 1) and operates to control the sequencing mechanism, namely automatically synchronizes and controls which of the micro light sources 6 is to be lit and turned off. Two input ports 11 are provided being associated with an input voltage supply, while the rest of the light source on/off operational steps is done automatically by the internal control unit 8.

In the example of FIG. 2C, an external control unit 12 is used that incorporates the light sequencing mechanism and the light source driver (18 and 20 in FIG. 1). The light source module 1 on its rear side is provided with N input ports 14 associated with N micro light sources, respectively, and appropriately separately operated by the control unit; and also one common connection port is used (not shown).

The sequencing mechanism consists of the following: The micro light sources 6 are lit for a short period of time per source, in such a manner that each time the most distant source is lit in a relative manner to the light source which was lit before it. This allows for reducing over heating in a single area defined by the light source module.

By appropriately sequencing the light sources 6, at any given time only one light source is being lit. After one light source has been lit for a certain period of time, the light source is turned off and another light source is turned on. Since at every given moment of time at least one light source in turned on, the entire light module is seen to the human eye as constantly lit for the required operation time.

The sequencing mechanism allows the light module to have smaller physical size, since heat generated by one light source is absorbed by the entire light module medium. Since every time a different light source is on, at any given time the light source that was previously on is now cooling down while other light source which is on heats up. This also enables over-current operation of the light source generating higher-peak power light pulses with better electrical to optical conversion efficiency.

The on time of each micro light source within the light source module and the selectivity of which of the sources will be lit according to their internal location can be selected and controlled according to the specific application requirements and a desired method of operating the light module.

Turning back to FIG. 1, the system 10 operates in the following manner: An input driving signal 16 is delivered to the light sequencing mechanism 18, which is configured and operable to carry out inter alia the control of the selective operation of the micro light sources, i.e., which micro light source is to be lit and during which time fraction. The light sequencing mechanism 18 delivers a signal to the light driver 20, which then physically operates the designated micro light source within the array of micro light sources 6 to generate light which is being projected outward of the module and then collected by the optics 4 to uniformly project the collected light outwards in a parallel manner.

Any required number of micro light sources 6 may be provided operating in the same wavelength (for example: red) or different wavelengths. The micro light sources 6 may be LEDs, lasers, or any combination of the two (including polarized source types, pulsed or continuous wave types). An example of the light source module can be a 2D addressable array of surface emitting (SE) lasers, for example VCSELs, or the new generation Surface-Emitting FP lasers (commercially available from Quintessence Photonics Corporation) which have an internal 45 degrees reflecting mirror.

VCSELs or a tightly packaged array of small low power Fabry-Perot (FP) Edge-Emitting (EE) lasers may advantageously be used for illuminating an optical path. VCSELs are miniature in size and are cost efficient; small low power FP (EE) are available in high volume applications such as optical storage. VCSEL operates with low threshold currents thus enabling high-density arrays; surface-normal emission of VCSEL and nearly identical to the photo detector geometry give easy alignment and packaging. VCSEL based approach provides low-cost potential because such devices are completed and tested at the wafer level. The VCSEL or SEFP array, e.g., a 6×6 array, emitting at 1060 nm may be used in a projector.

Unlike the typically Fabry-Perot (FP) cavity of an edge-emitting (EE) laser diode, which is 250 to 500 microns in length, the entire size of a VCSEL is limited only by the dimensions of the emitting region and space for electrical contacts. Thus, a die for a complete VCSEL can potentially be only slightly larger than the beam size. Currently available devices with a 5-25 μm circular beam are about 100 μm dimension (including heat dispersion surface), but this can certainly be reduced to 50 μm or less. A smaller size can translate into a larger yield per wafer and lower costs as well a higher packing density for laser array applications.

Comparing the Surface-Emitting (SE) laser to an EE laser diode, the following should be noted: The EE laser diode must be diced up (and possibly even mounted) just to determine which are good and which are not. They cannot be tested at all when being part of the original wafer, since the edges haven't been cleaved yet. This is an expensive time consuming process and results in a lot of wasted effort and materials. On the other hand, an entire wafer of SE lasers can be tested as a unit with each device evaluated for lasing threshold and power, beam shape, quality, and stability. For example it is possible to form millions of VCSELs on a single wafer as a batch process and then test and evaluate the performance of each one automatically. The entire wafer can be burned in to eliminate infant mortalities and assure higher reliability of the final product. Each device can then be packaged or thrown away based on these findings. The SE laser wafers can be diced to generate laser arrays of various sizes in a low cost fashion. Virtually the same equipment, that is used for the final assembly of integrated circuits based devices, can be used for VCSELs since they are attached flat on the package substrate and shine through a window like that of an EPROM (but of higher optical quality) or merged with an optical fiber assembly as required. Since active lasing semiconductor and mirrors are buried under the top surface layers, a hermetic seal is unnecessary. VCSELS can use inexpensive plastic packaging and/or be easily combined with other optical components as a hybrid or chip-on-board assembly. All this further contributes to reduced cost.

Turning back to FIGS. 1 and 2A-2C, the light source system (module) can be operable by pulse modulation along with the light sequencing mechanism, which allows for creating an optimal light module for projection systems where a light sequential operation is required and there is no requirement for continuous light operation, for example projection systems where R, G, B sources are sequentially lit to create a full color video image. In such systems a maximum of 33% of the on time is dedicated to each color source (R, G, B); thus the optimal light source would not be one which was primarily designed to work 100% of the time, but only 33% of the time.

Considering the VCSELs-based light source module, groups of VCSELs can be driven for very short time periods to cover the max 33% of the total color illumination. By doing so, more optical output can be squeezed from the VCSELs, and therefore each VCSELs group can be lit for a duty cycle of 5% and be turned off 95% of the time, while other groups of VCSELs cover the off time of the first group till filling the entire 95% off time of the first group and then the first VCSELs group is lit on again in a repetitive manner. Then, the VCSELs group has time to cool off, but the VCSELs can deliver higher peak power when they are being lit in short times than if they were to be on in continuous wave (CW) operational mode. Thus, the total optical power output from the light module for the max light duty cycle of 33% would be higher with relatively lower electrical power consumption in comparison to a high-power CW light source that would have been used only for a fraction of 33% of the time. Therefore power consumption is optimized.

The same technique can be formed and used in other illumination sources that can be combined with 2D VCSEL pumping array, for example LED dies. A group of LEDs can be lit a total of maximum 33% of the time, for its given color sequential operation, where individually each die is lit only about 5% of the 33% time and being off about 95% of the 33% time. The optical output can rise up by as much as a factor of up to 15 within such usage with LEDs if the total timing does not exceed 5 ms of the timing cycle. Since color sequential within projection displays requires at least 180 Hz of frame rate operation, then reaching 5 ms is not something that will serve as a limit or an obstacle.

Using a laser dies array, for example as a RED illumination source, the same method can be used thus reaching similar results.

It should be noted that the VCSEL array source and the laser die array source both can be of the kind delivering polarized output light and thus can advantageously be used with a spatial light modulator (SLM) by improving the light transmission through the SLM and the optical path with less heat dispersion, allowing the total physical system shrinkage to take place.

The present invention provides for using VCSELs array as the actual light source (and not as the pumping source), with the possible addition of a non-linear crystal for frequency doubling.

Illuminating with the light source system described above utilizing a VCSEL array and/or a laser die array causes different patterns of speckles to appear in each cycle. This allows for reducing the speckle contrast drastically by switching the VCSEL on and off, e.g., at a rate of 10 KHz (which is a low frequency switching for the VCSEL and a high frequency switching for the human eye), at a high duty-cycle of 95-99%. Each off-on cycle causes the VCSEL array to start at a random phase, thus generating a different speckle pattern. Hence, speckle reduction on the output image is obtained and a clear speckle free image is maintained. Since VCSELs are typically being used in telecommunication applications, even faster switching of the lasers is possible (up to millions of cycles per second), further reducing the speckle phenomena as speckles pattern keep changing each on cycle. The integration by the eye reduces the speckle contrast, below a view threshold.

The present invention also provides for a novel beam shaping technique. The beam shaping can be used to dramatically optimize/improve projection systems; as well as to improve other applications/systems such as optical elements fabrication. The beam shaping technique of the present invention is aimed at carrying out at least one of the following: combining structure light (a plurality of spatially separated light beams) into a single light beam of significantly higher intensity value (practically of the intensity of all the light beams together); affecting the intensity profile of at least one light beam to provide at least one output light beam of a substantially rectangular intensity profile; and producing from a plurality of spatially separated light beams a single light beam of a substantially rectangular intensity profile.

Figure 3:
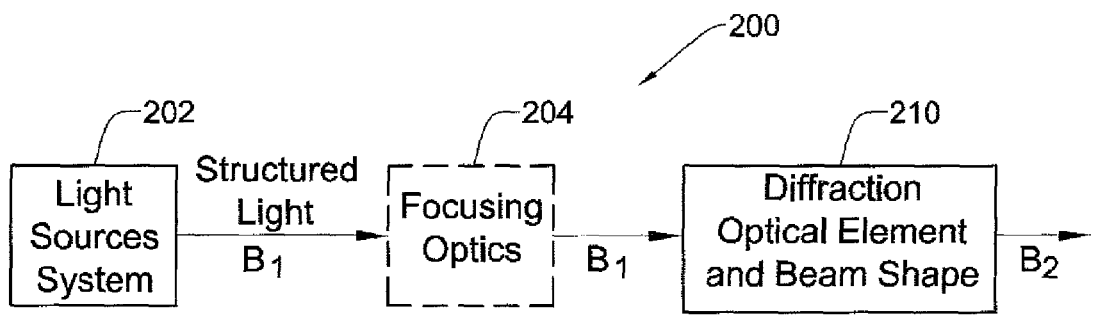
FIG. 3 is a block diagram of an optical system of the present invention.

FIG. 3 schematically illustrates an optical system 200 of the present invention. The system 200 includes a light source system 202; a beam shaping arrangement 210; and preferably also a light collecting/directing optics 204, which may and may not be a part of the light source system 202. The beam shaping arrangement as well may and may not be part of the light source system. The beam shaping arrangement may be completely or partially accommodated upstream of the focusing optics.

The light source system 202 is configured to produce structure light $B_1$, which may be achieved by using a single light source and a light splitting unit, or by using a multiple light source elements arrangement, for example configured as shown in FIG. 1A, namely having multiple micro light sources (e.g., VCSELs) located on a common substrate (wafer). The focusing optics 204 may include a single lens associated with the multiple light beams, or an array of lenses (lenslet array) associated with an array of light beams, respectively. The beam shaping arrangement 210 is configured as a diffractive optical unit, which may include an array of tophat elements for producing rectangular-profile light beams, and/or an inverse Dammann grating assembly for combining structured light into a single high-intensity light beam $B_2$.

Optionally provided in the beam shaping arrangement 210 and/or in the light source system 202 is at least one multi-pixel diffractive optical phase mask (filter), which may be configured using fractal approach based phase mask. Additionally optionally provided in the light source system 202 is a non-linear optical medium located either in the optical path of light $B_1$ (which is either a single or multiple beam light) or in the optical path of light $B_2$.

The beam shaping arrangement utilizing multi-pixel diffractive optical phase mask (filter) or fractal approach based phase mask, when lit with a light source system, can be designed to output a two-dimensional array of spots with equal energetic distribution. Such beam shaping methods can be used, for example, on a coherent illumination source to be split into an N×M array of miniature beamlets/spots to illuminate a pixel array of an SLM unit, where each pixel on the SLM is being individually illuminated, as if there were N×M miniature light sources formed, each attached to its own SLM pixel. Thus, the effectiveness of the light used for illuminating out an image from an SLM is maximal, without being blocked by the SLM black matrix (TFTs); moreover, avoiding overheating of the SLM and loosing large portion of light (brightness). Also, less powerful and more miniature light sources can be used. This illumination technique also delivers unified brightness over the projected image since each pixel is individually lit and the spread of brightness across the image is 100% unified. Using such beam shaping elements along with the illumination sources as used for projection displays, allows reducing the physical size of an SLM tremendously and opens up vast variety of new applications for display projection technology. A two-dimensional array of spots obtained by the beam shaping technique of the present invention may be used to fabricate a micro-lens array, as will be described more specifically further below.

Using an inverse Dammann element as the beam shaping means, namely, a Dammann grating element, where the input (light entrance) and output (light exit) are reversed, provides for turning an array of input light beams (spots) into a single high-intensity light beam/spot.

For example, an inverse Dammann element can turn a two-dimensional array of VCSEL spots into a single light beam/spot, used to pump a non-linear optical material (e.g. lasing/doubling crystal), creating an optimized pumping light source.

Figure 4:
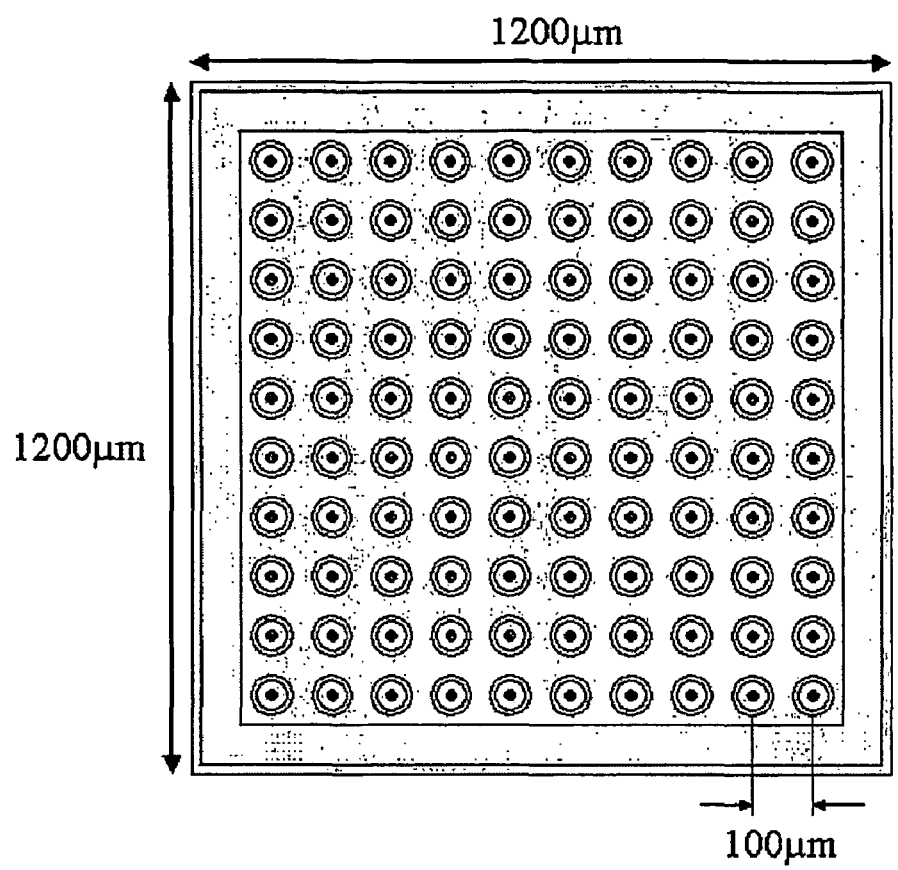
FIG. 4 exemplifies a light source module formed by a two-dimensional array of VCSELs.

FIG. 4 exemplifies a light source module 1 formed by a two-dimensional array of VCSELs. In this example, the module is formed by 10×10 matrix of the VCSELs arranged with a 100 μm pitch. The module has 1200 μm×200 μm dimensions.

The present invention provides a novel VCSEL assembly with beam shaping architecture. This is implemented by using non-linear optical material along with VCSELs. By this, light beams of visible spectrum can be obtained, for example green light or blue light. This can be achieved through pumping and then frequency doubling, or by direct frequency doubling. A two-dimensional VCSEL array (an array of micro light sources) can be fabricated to form the required optical output to pump a lasing crystal, which along with a special optical element (for example: micro-lens array, or inverse Dammann grating as will be described further below) forms a single light beam on the surface of the crystal.

It has been shown that the multi-mode VCSELs arrays are much more powerful and cheaper. However, due to the uncertainty in their spatial distribution, their beam shaping is not efficient. The inventors has used multi mode VCSEL array to pump a laser crystal and a non-linear optical material as a frequency doubling (e.g., the DPM1102 commercially available from CASIX, that is 1.5×2×2.5 mm$^3$; or any other non-linear optical crystal). The laser crystal generates radiation at 1064 nm and 914 nm and the non-linear optical crystal doubles it to green 532 nm and/or blue 457 nm.

A hybrid structure formed by lasing and non-linear optical crystal, termed DPM (Diode-Pumped Microchip laser) has been developed by CASIX. This DPM crystal combines Nd:YVO4 and KTP. The use of such hybrid (or composite) crystals simplifies construction of a low power green DPSS laser. These hybrid crystals virtually eliminate fiddling as a pastime since the HR, Nd:YVO4 (vanadate), KTP, and OC mirrors are all permanently aligned. For many applications, no additional optics is required. For the blue color wavelength, a different non-linear optical crystal should be used, e.g., BBO which is characterized by low cost and frequency doubling efficiency.

Figure 5:
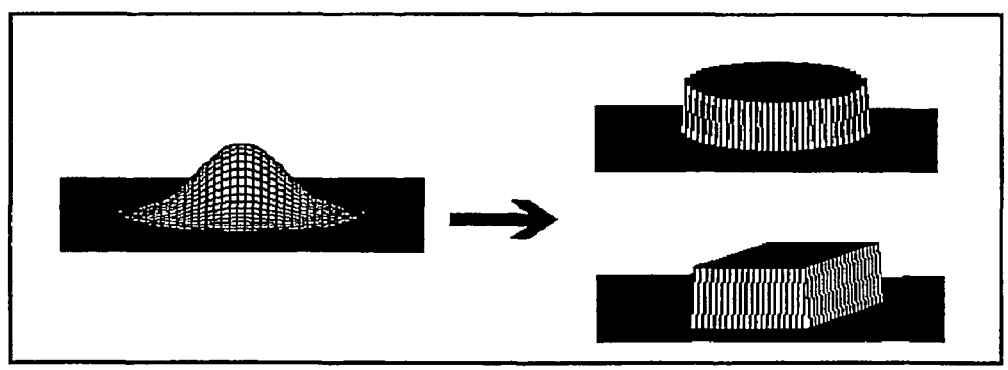
FIG. 5 illustrates the conversion of a Gaussian intensity profile to a tophat profile.

The output from the DPM or each output beam from a laser diode array typically has a Gaussian profile. In order to efficiently illuminate an SLM, as well as for other applications, a rectangular uniform-intensity beam profile is required. The present invention solves this problem by using a tophat element assembly, namely a single tophat element or an array of tophat elements. FIG. 5 illustrates in a self-explanatory manner the conversion of a Gaussian intensity profile to a tophat profile (rectangular profile with uniform energy distribution).

Reference is made to FIGS. 6A to 6F exemplifying optical systems of the invention utilizing beam shaping based on the use of a tophat element assembly.

Figures 6A, 6B, 6C:
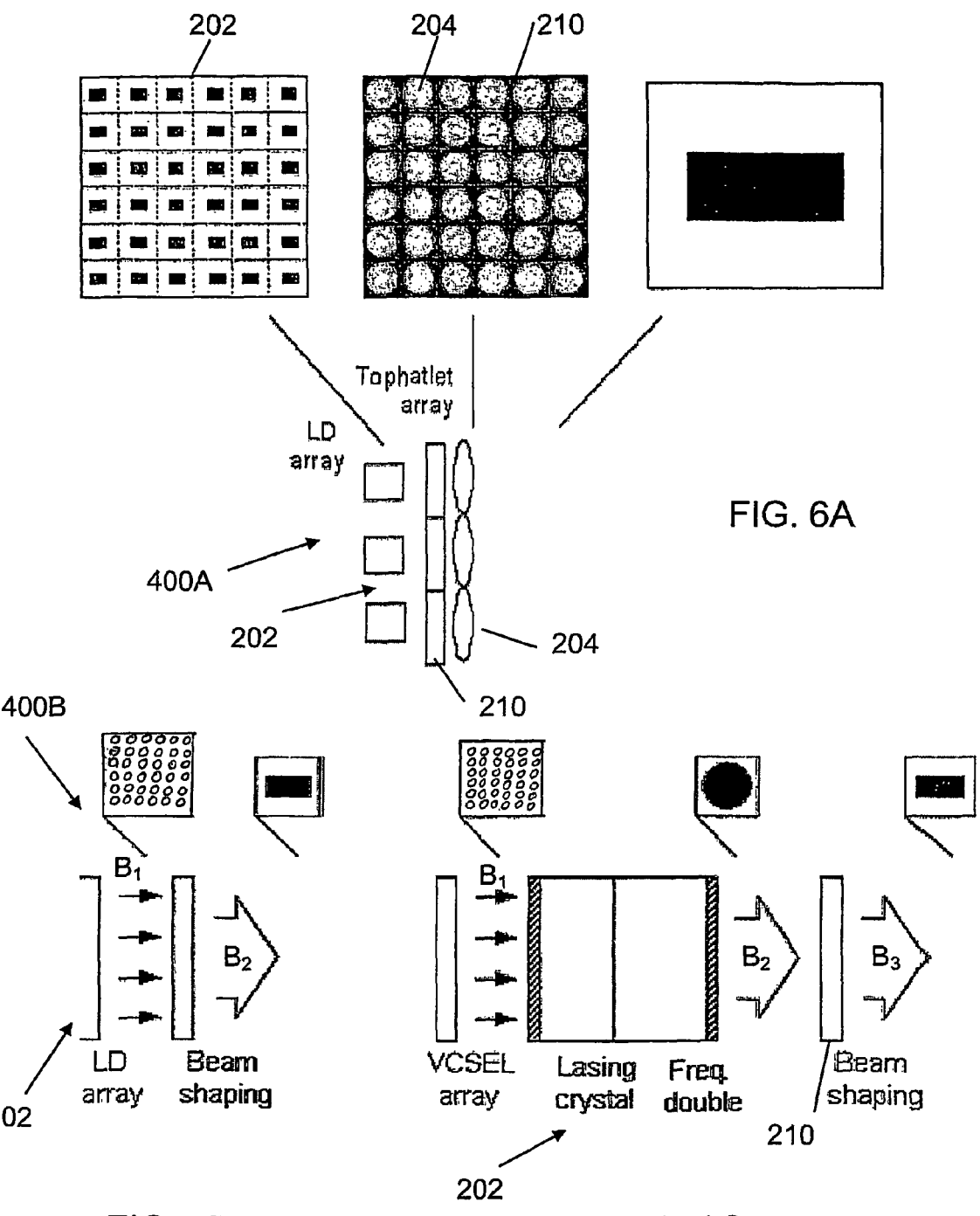
FIGS. 6A to 6F exemplify optical systems utilizing beam shaping based on the use of a tophat element assembly with simulation of beam shaping performed.

Optical system 400A of FIG. 6A includes a light source system 202 formed by a two-dimensional array of light source elements (6×6 array in the present example) such as a laser die array or surface emitting laser array); a diffractive optical unit 210 including a two-dimensional array of tophat elements each associated with the respective one of the laser source elements (i.e., light beam produced by the laser source element); and focusing optics 204 including a two-dimensional array of lenses each associated with the respective one of the tophat elements. The laser dies are very cost efficient solution for producing the red color illumination. The laser dies are coming from the CD and DVD player industry and thus their prices are extremely low while they produce significant output power (7 mW for low price modules). They are single mode laser and thus allow efficient beam shaping.

The beam profile at the output of each laser source element in the array is Gaussian. In order to convert it into the uniform rectangular cross section beam, the tophatlet array 210 is used, where each tophat element shapes the respective beam from the laser dies array. Hence, each Gaussian-profile light beam generated by the light source element is shaped to form a rectangular-profile uniform-intensity beam; and a two-dimensional array of such rectangular-profile parallel beams is thus provided together covering substantially the entire area of a multiple-pixel arrangement (e.g., SLM). It should be noted that the tophatlet array can be designed to produce multiple beams each of the rectangular uniform intensity profile corresponding to the geometry of a single pixel from a multiple-pixel arrangement (e.g., SLM), or can be configured to provide from each of the laser beams in the array a rectangular uniform beam profile substantially equal to the size of the entire multi-pixel arrangement so that all the beams are superimposed on each other and their energy is summed with low loss due to the low coherency between each of the laser source elements.

In the example of FIG. 6B, optical system 400B includes a light source system 202 including a red laser based upon an array of laser dies each generating a light beam $B_1$ at 650 nm; and a beam shaping arrangement 210 in the form of a two-dimensional array of tophat elements. Each tophat element is aligned with a respective one of the light beams $B_1$. Light beams $B_2$ emerging from the tophat element assembly are of a rectangular cross section with uniform intensity profile.

In the example of FIG. 6C, optical system 400C includes a green or blue light source system 202 based upon a VCSEL array as the energy source at 808 nm, a 1064 nm lasing crystal with KTP for frequency doubling; a beam shaping arrangement 210 including a tophat diffractive optical element operating to turn the Gaussian profile of light generated by the light source system 202 to a rectangular cross-section light beam. An array of spatially separated Gaussian-profile light beams $B_1$ from the VCSEL array produces a single close to Gaussian-profile light beam $B_2$ of a different wavelength (than that of light $B_1$) emerging from the non-linear crystal. This light beam $B_2$ then passes through the tophat element assembly 210 formed by a single tophat element, resulting in an output light beam $B_3$ of a rectangular cross section with uniform intensity profile. It should be noted that additional focusing optics can optionally be used in the optical path of light beams $B_1$ to improve the pumping efficiency.

Figure 6D:
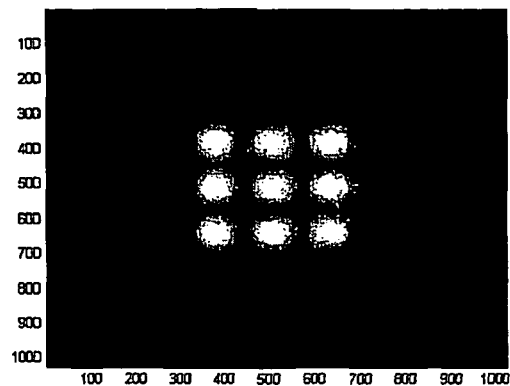
Figure 6E:
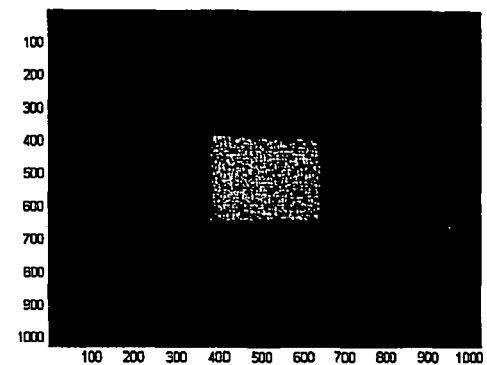

FIGS. 6D and 6E show a simulation of the light beam profile (a two-dimensional array of light beams) before (FIG. 6D) and after (FIG. 6E) the light passage through an array of tophats (tophatlet array). As shown, after the light passage through the tophat assembly, a light beam has rectangular uniform intensity profile.

Figure 6F:
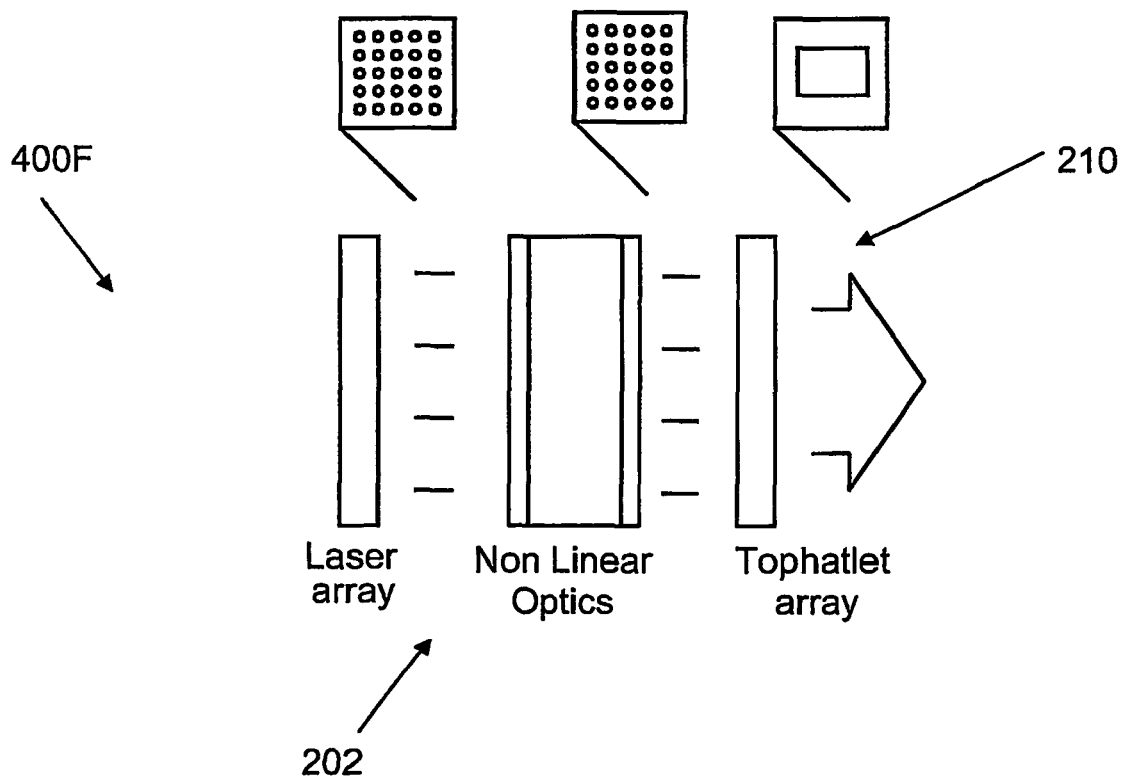

FIG. 6F illustrates an optical system 400F including a light source system 202 and a beam shaping arrangement 210. The light source system 202 is configured to generate green or blue light by directly doubling the laser beam by a non-linear medium. The light source system thus includes a VCSEL array as the energy source at 1060 nm or 910 nm with non-linear optical material, such as KTP, BBO, PPLMN, LBO crystals or non-linear polymers. The diffractive beam shaping arrangement 210 includes a tophatlet array in the optical path of multiple beams exiting the non-linear material. As a result, the output beam profile is that show in FIG. 6E.

It should be noted that the non-linear material together with the necessary wavelength sensitive coating (e.g. Anti Reflective/Highly Reflective) could be affixed on top of the laser array in such a way as to be part of the laser array's resonator structure to form an extended cavity and improve the frequency doubling efficiency. Affixing of the non-linear optical material to the laser array may for example be carried out by direct deposition, direct crystal growth, mechanical gluing, or spin coating, or a combination thereof.

It should also be noted that in order to optimize the crystal pumping, the VCSELs may be operated using the above-described sequencing mechanism, such that at each moment of time only a group of the VCSELs is operative. The VCSELs can be lit on and off in groups in different timings when each group lases over the crystal in a different location within the total lasing surface, thus allowing better dispersion of heat along the coating substrate and maintaining better reliability of the coatings over the crystal, while avoiding over heating of a single spot and preventing the coating from burning. As a result, a higher power can be driven with smaller and/or cheaper crystals.

It should be understood that in order to operate in visible spectral range, it is also possible to use VCSEL arrays or similar array arrangements with a given wavelength of Green, Red or Blue as illumination channels without the crystal pumping.

The tophat element assembly should be appropriately designed to provide the beam cross section corresponding to the shape to be illuminated, for example the SLM pixel or the entire SLM active area.

Figure 7A:
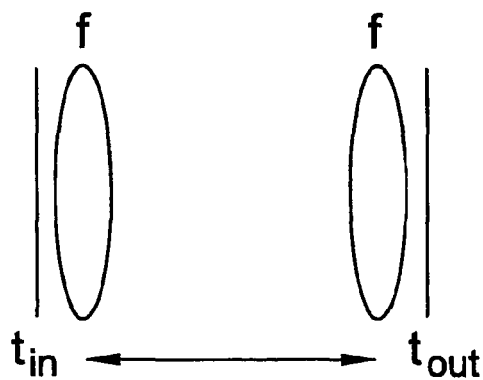

An important application of diffractive optical elements is their capability to perform beam shaping, within limits defined by the wave equation constraints. A general optical set up for achieving beam shaping is illustrated in FIG. 7A. The input distribution $t_{in}$ is multiplied by a phase only filter (diffractive optical element), then a first lens with proper free space propagation and a second lens are used to perform a Fourier transform of this multiplication.

Figure 7B:
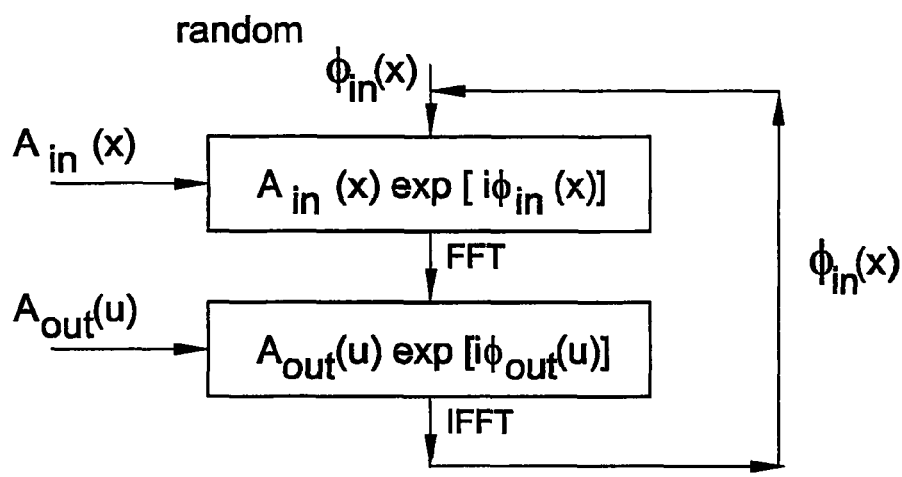

An iterative algorithm is used to calculate the spatial phase filter where a random phase is chosen at the beginning and the constraints are the amplitude of the input and the output planes. In each iteration, the phase is multiplied by the input amplitude and then a Fast Fourier Transform (FFT) is performed. The so-obtained phase is multiplied by the output amplitude and an Inverse Fast Fourier Transform (IFFT) is performed. Now, the obtained phase becomes the input phase for the second iteration. This iterative algorithm is shown in FIG. 7B. After several iterations, convergence occurs.

Figure 7C:
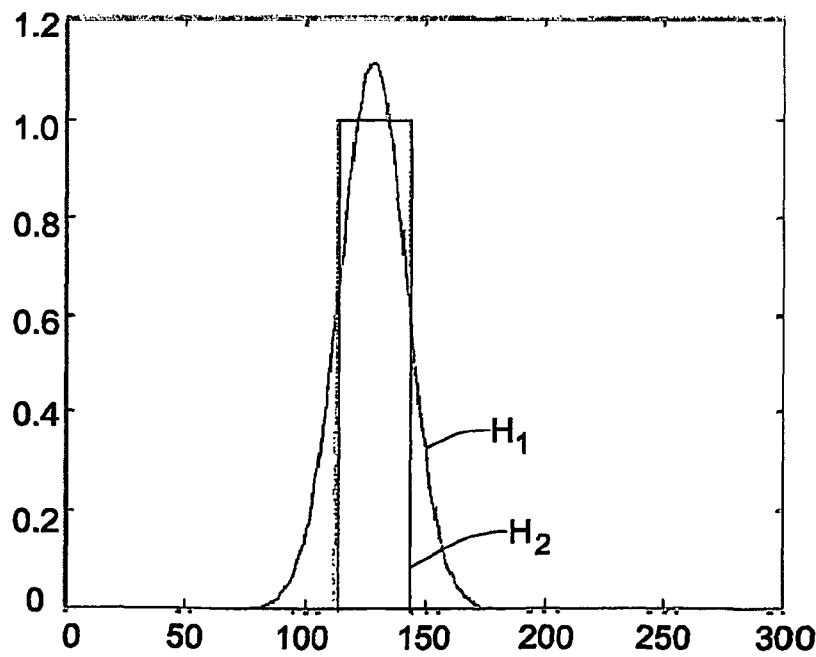

After calculating the phase only filter, using MATLAB, the filter can be fabricated by binary optics methods, which will be described further below or similar linear optics methods. FIG. 7C shows the input field distribution, which is a Gaussian field (curve $H_1$) and the constraint output shape which is rectangular (curve $H_2$). The amplitude of the desired output shape was chosen so that the energy of the output plane was equal to the energy of the input plane.

In the simulation, three different methods were used. The first method was a regular FFT, the second method used was a Fractional Fourier Transform (FRT) with order p (chosen for smallest RMS error value), and in the third method, instead of FFT or FRT, Fresnel transform for a distance z (again chosen for smallest RMS value) was used. The simulation results are illustrated in FIGS. 7D-7G: FIG. 7D shows curve A1 corresponding to the regular FFT and curve A2 corresponding to the FRT, FIG. 7F shows the Fresnel transform result, FIGS. 7E and 7G illustrate the RMS as a function of the number of iteration for all three cases (convergence rate). As shown, the Fresnel approach yields better results. Additionally, it is advantageous since it does not require the Fourier transform lenses. Hence, this approach is preferably chosen for designing the tophat element assembly.

Turning back to FIGS. 6B and 6C, the tophat element is preferably placed immediately after the light source system, i.e., (after the laser die array in FIG. 6B, and/or after the DPM structure (laser and non-linear optical medium) in FIG. 6C. Since providing a zero distance is practically impossible, the tophat assembly is placed at a small distance from the output of the light source system (i.e., not at the beam waist), and the element design takes this into consideration.

Figure 8:
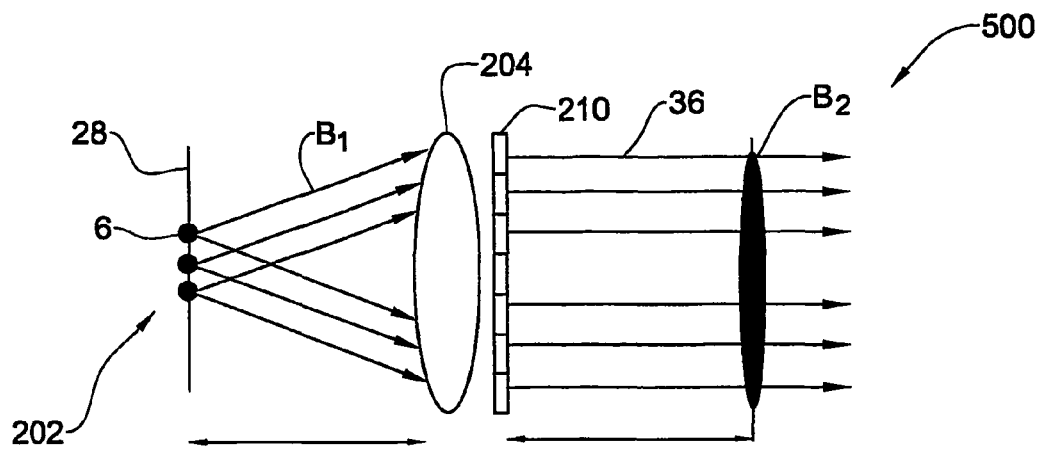
FIG. 8 exemplifies an optical system of the present invention utilizing an Inverse Dammann optical element as the beam shaper.

Reference is made to FIG. 8, schematically illustrating an optical system 500 utilizing an Inverse Dammann optical element as the beam shaper. The system 500 includes a light source system 202 formed by an array of micro light source elements 6; a focusing optics 204 (common collection lens); and a beam shaping arrangement 210 including an Inverse Dammann grating assembly. The system 500 is thus configured and operable to convert an array of incoming low-intensity light beams $B_1$ into a single high-intensity light beam $B_2$. Light source elements 6 project beams $B_1$ towards the collection lens 204, and then the beams are converted by the inverse Dammann grating assembly 210 into a plane wave (a single light beam) $B_2$.

This optical system can be used, for example, within a projection system with VCSELs groups/arrays to pump a non-linear optical crystal in order to form a visible range wavelength illumination source, where the beamslets of the VCSELs group are translated by beam shaper into a single light spot on the active pumping area of the non-linear optical crystal. It should be noted that the array of light source elements can have any type of arrangement, any number of light source elements and a variety of light source types (lasers: VCSELs, laser dies; LEDs).

An inverse Dammann is a Dammann gratings element, where the input (light entrance) and output (light exit) are reversed. The Inverse Dammann grating element provides for turning an array of spots into a single light beam/spot, e.g., for turning an array of VCSEL light spots to a single light spot (capable of pumping the doubling or lasing crystal).

The use of Dammann gratings is an analytical approach for realizing a desired spot distribution at Fourier plane by using a binary phase only gratings. The transition points between "−1" to "1" transparency value are computed by solving a set of equations yielding the required spot structure. Illuminating a Dammann grating with a single light beam/spot can be designed to generate a 2D array of spots with equal energetic distribution. This approach may be used for generating any desired spot distribution at the Fourier plane. This 2D array of spots can be used, for example, as the illumination source of an SLM in a very optimized way.

Figure 9A:
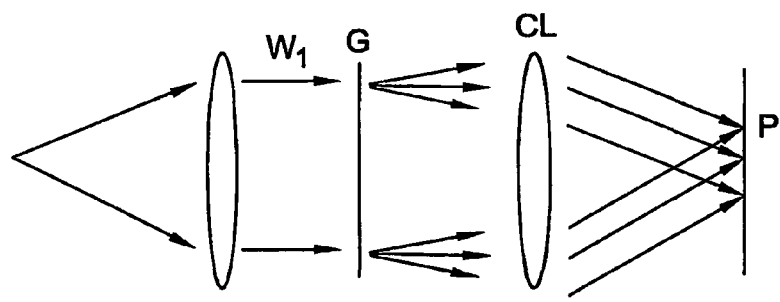
Figure 9B:
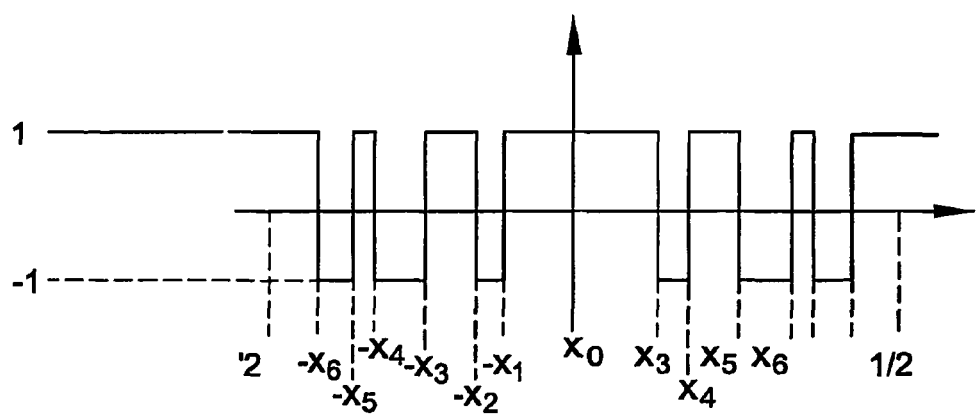
Figure 9C:
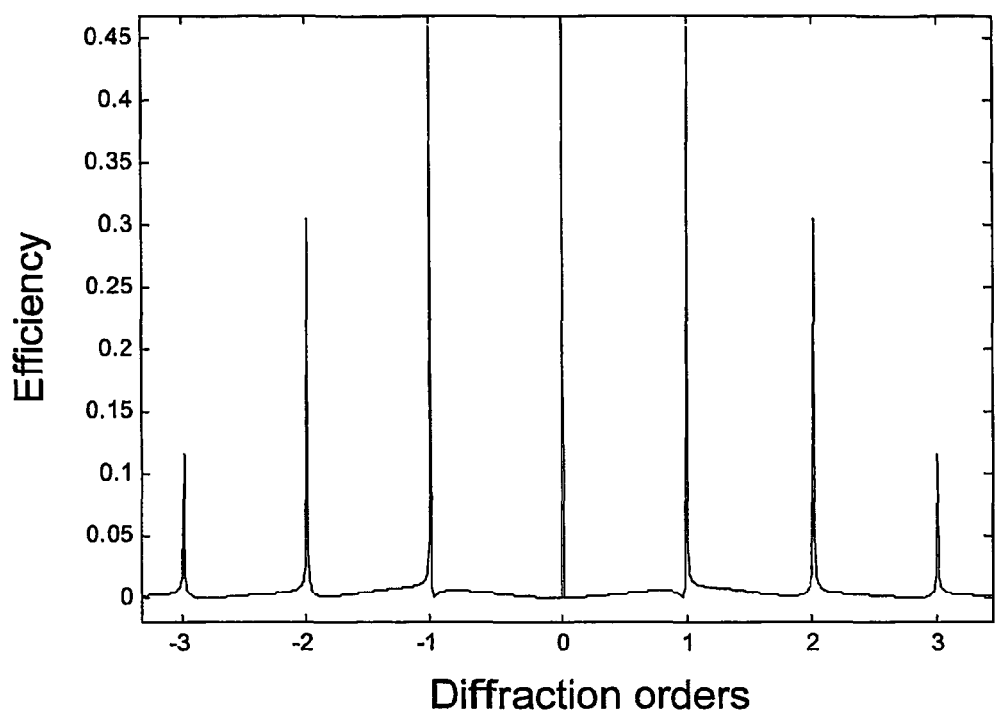

Dammann gratings are binary diffractive optical elements, having several diffraction orders of equal intensity, used to multiplex images from one input object. FIG. 9A illustrates, in a self-explanatory manner, an optical setup that can be used for this purpose. A coherent plane wave $W_1$, normally impinging onto a grating G, is diffracted by the grating G, and an output pattern P appears in the back focal plane of a converging lens CL. Dammann gratings can be designed to have 3, 5, 7 or more equal diffraction orders. FIG. 9B illustrates the grating transparency function in one dimension. The only free parameters in the one-dimensional transparency function are the transition points $x_1, x_2, x_3 \ldots x_n$. A grating with n transition points will result in (2n+1) central diffraction orders. The output of a Dammann grating with n=1 is illustrated in FIG. 9C: there are three equal orders having 62% of the input energy; the rest of the energy is distributed among higher diffraction orders An inverse Dammann grating can be used in order to transform an array of low-intensity light sources into one high-intensity plane wave emitting light source. If the optical set up of FIG. 9A is used with an inverse Dammann grating, an array of point sources transforms into one point source with higher intensity.

Figure 10A:
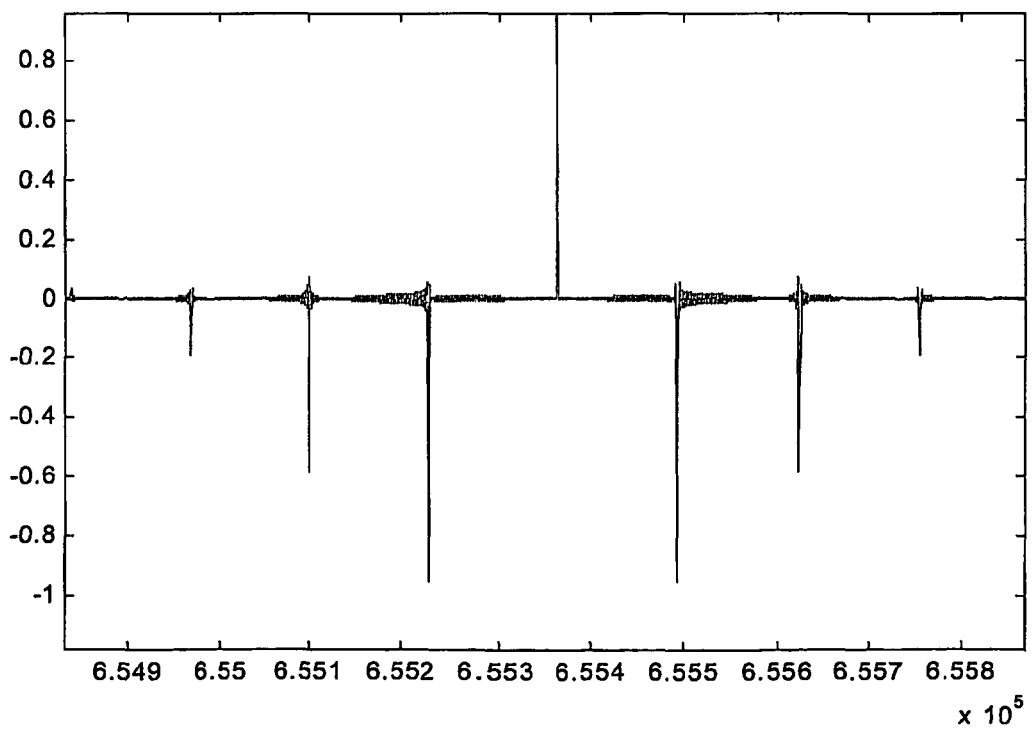

Turning back to FIG. 8, the inventors used this setup to transform an array of coherent point sources into a wide light source. Here, an array of point sources is transformed into a plane wave by the Dammann grating 210 and the lens 204. An input containing a matrix of nine point sources was chosen, which is illustrated (in one dimension) in FIG. 10A. The light intensity in the output plane was calculated by MATLAB simulation. In the output plane (one focal length from the lens), the obtained intensity was calculated, as illustrated in two dimensions in FIG. 10B and in one dimension—in FIG. 10C. A one-dimensional Fourier transform of the light intensity in the output plane is illustrated in FIG. 10D, where it can be seen that indeed 90% of the intensity is in the zero order. This indicates the efficiency of this optical setup.

Figure 10B:
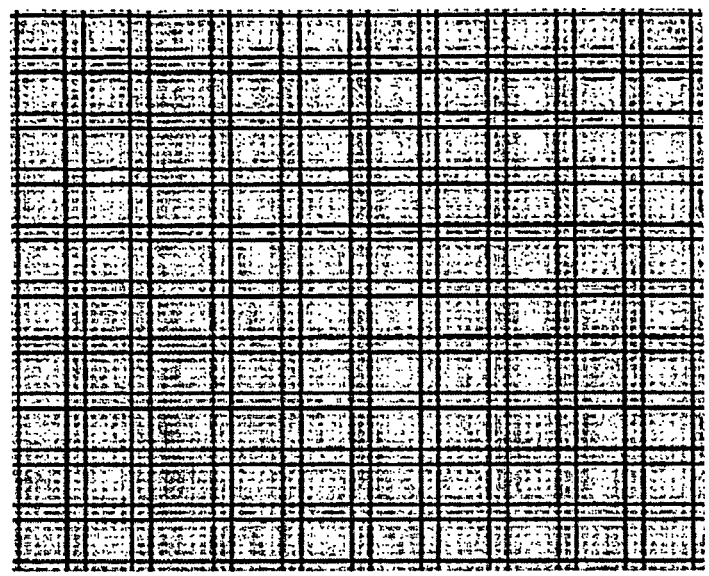
Figure 10C:
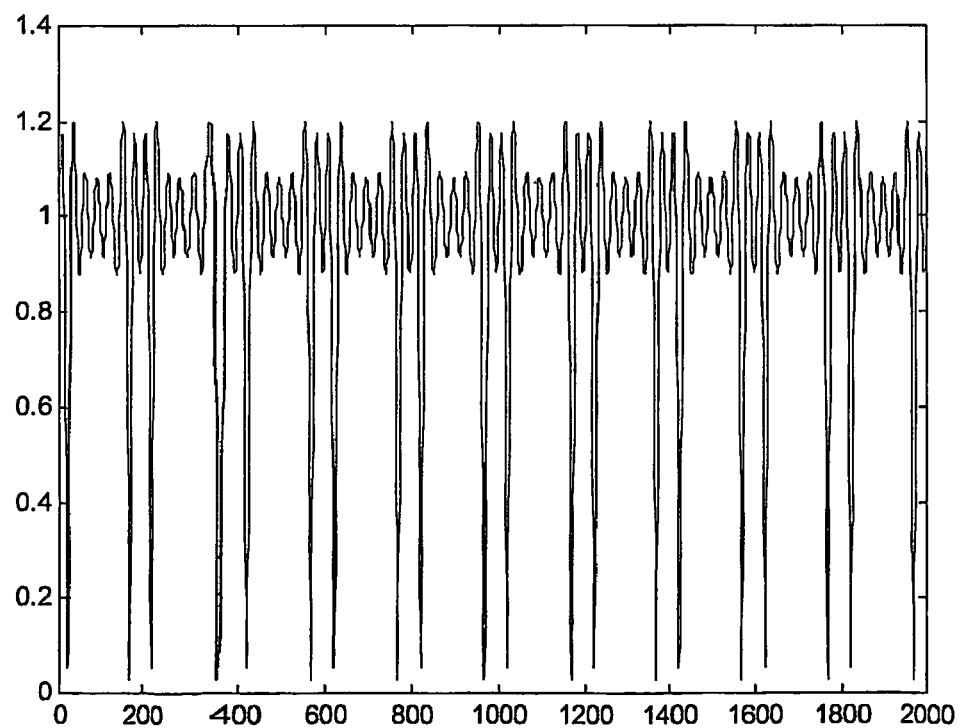
Figure 10D:
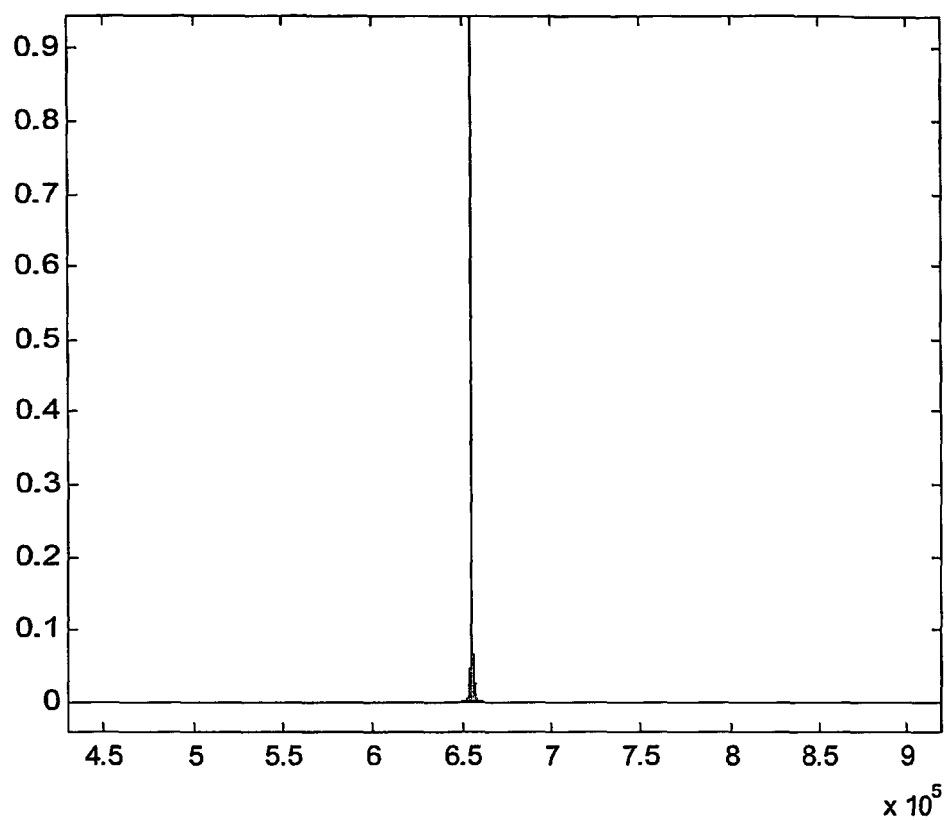
Figure 10E:
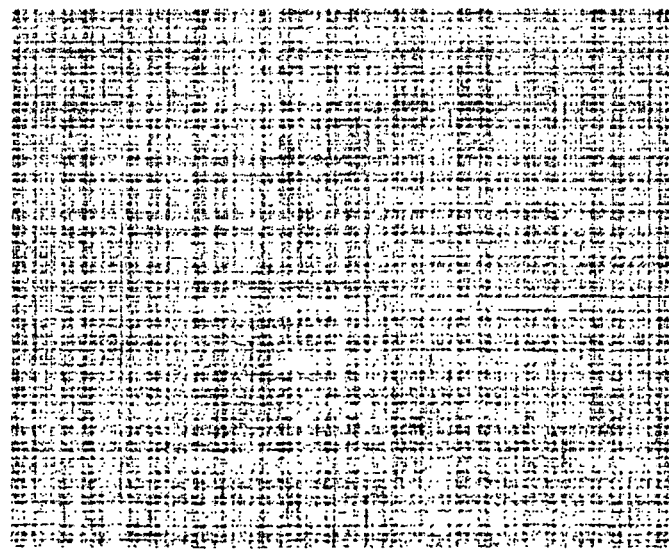
Figure 10F:
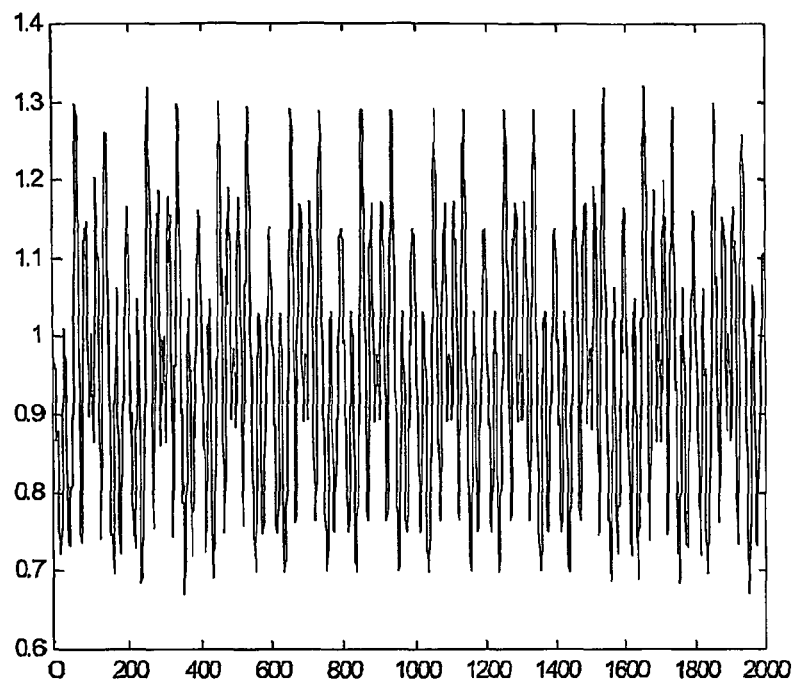

As can be seen from FIGS. 10B and 10C, the light intensity is not uniform and has sharp descents to zero. This is because the input has a finite number of orders. Nevertheless, the spot becomes uniform, when moving farther from the focal plane of the lens. FIG. 10E illustrates the light intensity after free space propagation (FSP) a distance of one focal length from the focal plane of the collection lens 204. Longer distance propagation will smooth the spot further. FIG. 10F illustrates the same light intensity in one-dimension after the FSP.

As can be seen from the figures, at a distance from the focal plane there are no more jumps to zero. This is due to the low-pass filter nature of the FSP. An additional optical low-pass filter may be applied if required, to appropriately limit the FSP length.

Considering the setup of FIG. 8, the VCSEL array 202 is placed at the focal plane of the collection lens 204. Hence, after the lens, its Fourier transform is obtained. At that plane, the inverse-Dammann element is placed. A relation between the focal length f, source spot size d and obtained spot size D in a Fourier-transform lens is determined as:

$$\frac{\lambda \cdot f}{d} = D$$

For example, if D=2 mm, λ=808 nm, and d is the active area of the individual VCSEL, i.e., is about 3-10 μm, then f=9.9 mm (for d=4 μm). The inverse Dammann grating 210 is placed immediately after the lens 204. The aperture of the lens 204 should be larger than the light spot size D. Since the light spot is small (D=2 mm), a lens with aperture of 5 mm or less could be chosen.

Another issue that needs to be considered is the grating resolution. To estimate it, we will use:

$$\frac{\lambda \cdot f}{A} = R$$

wherein A is the illumination area, and R is the resolution (feature size). In this design, A is the VCSEL array area and R is the feature size at the Fourier plane. Using the 14×14 array (which is shown to be the worst case), with overall size of 16×16 mm², these parameters yield resolution of λf/A=10 μm. As the Dammann grating has rapid changes, its resolution can be assumed as an order of magnitude larger than the output resolution, hence a resolution of 1 μm can be obtained, which is well within manufacturing ability.

Figure 11:
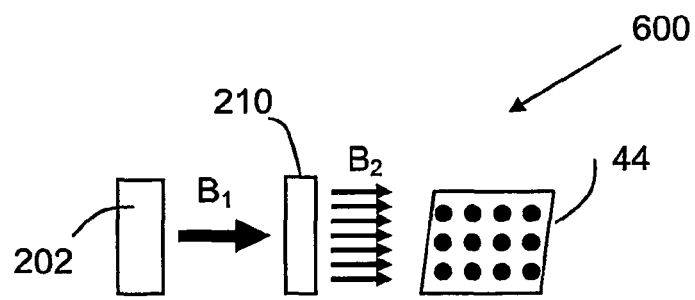
FIG. 11 schematically illustrates an optical system of the present invention utilizing a diffractive optical unit to convert a single light beam into a 2D array of beamlets.

Reference is made to FIG. 11 schematically illustrating an optical system 600 utilizing a diffractive optical unit to convert a single light beam into a 2D array of beamlets. The system 600 includes a light source system 202; and a beam shaping arrangement 210. The light source system 202 is configured to generate a single or multiple light beam $B_1$ (laser, LED); the beam shaping arrangement 210 includes for example an array of Dammann gratings arranged in a cascaded manner, or multi-pixel phase mask element designed with or without fractal beam shaping approach. The beam shaper 210 thus converts the light beam $B_1$ into a desired 2D array of beamlets $B_2$. To this end, the diffractive optical unit 210 (the mask of beamlets) is appropriately designed in accordance with required sizes of beamlets' diameter and pitch of the beamlets pattern. The array of beamlets $B_2$ lights an output plane 44, which can be any desired plane requiring illumination (for example: a photo-resistive material illuminated to generate a patterned array structure, or an SLM clear aperture area where the mask was designed to be a perfect fit with relative pixel sizes on the SLM as to maximize light efficiency through the SLM with minimum blocking).

As indicated above, the diffractive optical unit 210 may include several Dammann gratings arranged in a cascaded manner, such that each spot of the first Dammann is fed to a second cascaded Dammann element individually, thereby multiplying the number of spots of the first Dammann. Alternatively, the diffractive optical unit 210 may be a special multi-pixel diffractive phase mask element, set to fit to beamlets size requirements and pitch size requirements as so to be capable to illuminate the desired output plane/surface in an optimized manner. In cases where large arrays are needed, the multi-pixel diffractive phase mask element might be designed as a fractal beam shaping element.

Multi-pixel diffractive optical phase mask (filter) is an analytical solution for a phase only filter, extracting uniform 2-D array of spots. The improved performance of this type of diffractive optical element is obtained by applying mathematical constraints dealing with equal energetic content in each one of the spots in the array, rather than having uniformity in shape of each spot. Such energetic condition is applicable, for example, in cases where the generated 2D array aims to illuminate a 2D array of pixels of an SLM. The 2D array of light beamlets then impinges individually on every pixel of the SLM thus improving the efficiency. For example, an SLM with a resolution of 1024×768 active pixels will have sets of 1024×768 beamlets individually to each pixel. By doing so, degradation of light from the TFT mask of the SLM and dispersion of light on inactive surfaces/areas can be avoided.

The following is the explanation of analytical solution for a phase only filter extracting uniform 2D array of spots. The output plane, where a 2D array of spots is obtained, is defined as the Fourier transform of a phase only element:

$$F(\mu) = \int_{-\infty}^{\infty} \exp[i\phi(x)]\exp(-2\pi i x \mu)dx \quad (1)$$

wherein x is the spatial variable, u is the spatial frequency variable, φ(x) is the phase function, and F(μ) is the Fourier transform.

The energy at the output plane in a specific impulse equals to:

$$E_n \int_{n\Delta\mu}^{(n+1)\Delta\mu} |F(\mu)|^2 d\mu \quad (2)$$

Thus, two constraints for analytical optimization process will be defined:

$$\int_{k\Delta\mu}^{\Delta\sigma+k\Delta\mu} |F(\mu)|^2 d\mu = 0 \quad (3)$$

$$\int_{\Delta\sigma+n\Delta\mu}^{\Delta\mu+n\Delta\mu} |F(\mu)|^2 d\mu = \int_{\Delta\sigma+m\Delta\mu}^{\Delta\mu+m\Delta\mu} |F(\mu)|^2 d\mu = \gamma \quad (4)$$

Figure 12:
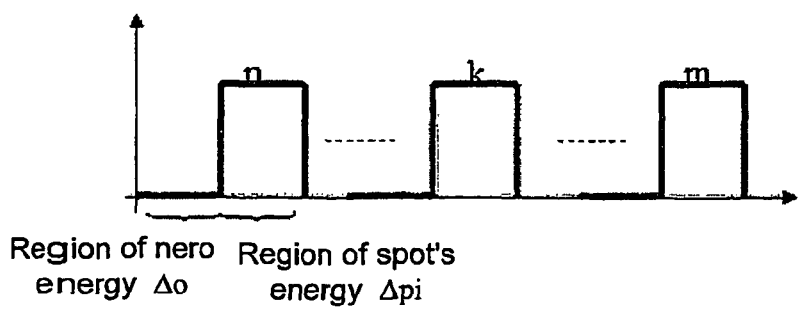
FIG. 12 illustrates the principles analytical solution for a phase only filter showing notations for the mathematical derivation for a region between energy spots ($\Delta\sigma$) where the output must be zero, and a region where the spot appears ($\Delta\mu$)

The parameters Δσ and Δμ are defined in FIG. 12, which shows notations for the mathematical derivation, wherein Δσ is the region between energy spots where the output must be zero; and $\Delta\mu$ is the region where the spot appears. The shape of the spot is not important as long as its energy is equal to the other spots. This leads to the following two cost functions to be minimized:

$$\varepsilon_1 = \int_{k\Delta\mu}^{\Delta\sigma+k\Delta\mu} |F(\mu)|^2 d\mu \quad (6)$$

$$\varepsilon_2^2 = \left(\int_{\Delta\sigma+n\Delta\mu}^{\Delta\mu+n\Delta\mu} |F(\mu)|^2 d\mu - \int_{\Delta\sigma+m\Delta\mu}^{\Delta\mu+m\Delta\mu} |F(\mu)|^2 d\mu\right)^2$$

which means solving the following equation set:

$$\frac{\partial}{\partial\phi}\varepsilon_1 = 0 \quad (7)$$

$$\frac{\partial}{\partial\phi}\varepsilon_2^2 = 0$$

This leads to:

$$\frac{\partial}{\partial\phi}\left(\int_{k\Delta\mu}^{\Delta\sigma+k\Delta\mu} |F(\mu)|^2 d\mu\right) = 0 \quad (8)$$

and:

$$\left[\frac{\partial}{\partial\phi}\left(\int_{\Delta\sigma+n\Delta\mu}^{\Delta\mu+n\Delta\mu} |F(\mu)|^2 d\mu\right)\right]\left[1 - \left(\int_{\Delta\sigma+m\Delta\mu}^{\Delta\mu+m\Delta\mu} |F(\mu)|^2 d\mu\right)\right] - \quad (9)$$

$$\left[\frac{\partial}{\partial\phi}\left(\int_{\Delta\sigma+m\Delta\mu}^{\Delta\mu+m\Delta\mu} |F(\mu)|^2 d\mu\right)\right]\left[\left(\int_{\Delta\sigma+n\Delta\mu}^{\Delta\mu+n\Delta\mu} |F(\mu)|^2 d\mu\right) - 1\right] =$$

Starting with the first equation (Eq. 8), $\phi=\phi_0+\delta\phi$ will be defined in order to compute $|F(\mu)|^2=|F_0(\mu)|^2+\delta\{|F(\mu)|^2\}$ where $\delta\{F(\mu)|^2\}$ is the differential of $|F(\mu)|^2$ which is related to the differential of $\epsilon_1$.

Assuming small variations of the phase $\delta\phi\ll\phi_0$, $\delta\phi\gg(\delta\phi)^2\to 0$ yields:

$$\exp(i\phi)\approx\exp(i\phi_0)[1+\delta\phi]$$

and:

$$\delta\{|F(\mu)|^2\}=i\iint[\delta\phi(x_1)-\delta\phi(x_2)]\exp[i\phi(x_1)-i\phi(x_2)]\exp[2\pi i\mu(x_2-x_1)]dx_1 dx_2 \quad (10)$$

Since the differential of the error is $$\delta\varepsilon_1 = \int_{k\Delta\mu}^{\Delta\sigma+k\Delta\mu} \delta\{|F(\mu)|^2\} d\mu = 0 \quad (11)$$

one obtains:

$$\int_{k\Delta\mu}^{\Delta\sigma+k\Delta\mu} \delta\{|F(\mu)|^2\} d\mu = i\int \delta\phi(x_1)[T(x_1) - T^*(x_1)] = 0 \quad (12)$$

where:

$$T(x_1) = \exp(i\phi(x_1))\left[\int \exp(-i\phi(x_2))\left(\int_{k\Delta\mu}^{\Delta\sigma+k\Delta\mu} \exp(2\pi i\mu(x_2-x_1))d\mu\right)dx_2\right] \quad (13)$$

It should be note that:

$$\int_\alpha^\beta \exp(2\pi i\mu(x_2-x_1))d\mu = \quad (14)$$

$$(\beta-\alpha)\exp[\pi i(x_2-x_1)(\beta+\alpha)]\mathrm{sinc}[(x_2-x_1)(\beta-\alpha)]$$

where:

$$\mathrm{sinc}(\xi) = \frac{\sin(\pi\xi)}{\pi\xi} \quad (15)$$

and thus:

$$T(x_1)=\exp(i\phi(x_1)[\exp(-i\phi(x_1)\otimes(\Delta\sigma\exp[\pi i x_1(\Delta\sigma+2k\Delta\mu)]\sin c(x_1\Delta\sigma))] \quad (16)$$

where $\otimes$ denotes correlation integral.

Since according to Eq. 12, the equation is to be zero for all variation of the phase, one obtains:

$$T(x_1)-T^*(x_2)=0 \quad (17)$$

wherein asterisk indicates complex conjugate operation. This leads to the fact that the imaginary part of $T(x1)$ must be zero and thus:

$$f_i(x_1) = \cos[\phi(x_1)] \otimes [\sin(\pi x_1(\Delta\sigma+2k\Delta\mu))\mathrm{sinc}(x_1\Delta\sigma)] + - \quad (18)$$
$$\sin[\phi(x_1)] \otimes [\cos(\pi x_1(\Delta\sigma+2k\Delta\mu))\mathrm{sinc}(x_1\Delta\sigma)] +$$
$$f_r(x_1) = \cos[\phi(x_1)] \otimes [\cos(\pi x_1(\Delta\sigma+2k\Delta\mu))\mathrm{sinc}(x_1\Delta\sigma)] + -$$
$$\sin[\phi(x_1)] \otimes [\sin(\pi x_1(\Delta\sigma+2k\Delta\mu))\mathrm{sinc}(x_1\Delta\sigma)]$$

and:

$$\tan[\phi(x_1)] = \frac{f_i(x_1)}{f_r(x_1)} \quad (19)$$

Thus, the optimal phase fraction may be extracted by applying the inverse tan operation.

Now, the equation related to the second optimization condition on $\epsilon_2^2$ can be derived.

$$\frac{\partial}{\partial\phi}\varepsilon_2^2 = 2\frac{\partial}{\partial\phi}\left(\int_{\Delta\sigma+n\Delta\mu}^{\Delta\mu+n\Delta\mu} |F(\mu)|^2 d\mu\right) + 2\frac{\partial}{\partial\phi}\left(\int_{\Delta\sigma+m\Delta\mu}^{\Delta\mu+m\Delta\mu} |F(\mu)|^2 d\mu\right) + - \quad (20)$$

$$2\left[\left(\int_{\Delta\sigma+m\Delta\mu}^{\Delta\mu+m\Delta\mu} |F(\mu)|^2 d\mu\right)\frac{\partial}{\partial\phi}\left(\int_{\Delta\sigma+n\Delta\mu}^{\Delta\mu+n\Delta\mu} |F(\mu)|^2 d\mu\right) + \left(\int_{\Delta\sigma+n\Delta\mu}^{\Delta\mu+n\Delta\mu} |F(\mu)|^2 d\mu\right)\frac{\partial}{\partial\phi}\left(\int_{\Delta\sigma+m\Delta\mu}^{\Delta\mu+m\Delta\mu} |F(\mu)|^2 d\mu\right)\right] = 0$$

Applying similar mathematical manipulations and using Eq. 14 one obtains:

$$f_i^{(n)}(x_1) = \cos[\phi(x_1)] \otimes \begin{bmatrix} \sin(\pi x_1(\Delta\sigma + \Delta\mu + 2n\Delta\mu)) \\ \mathrm{sinc}(x_1(\Delta\mu - \Delta\sigma)) \end{bmatrix} + - \quad (21)$$

$$\sin[\phi(x_1)] \otimes \begin{bmatrix} \cos(\pi x_1(\Delta\sigma + \Delta\mu + 2n\Delta\mu)) \\ \mathrm{sinc}(x_1(\Delta\mu - \Delta\sigma)) \end{bmatrix} +$$

$$f_i^{(m)}(x_1) = \cos[\phi(x_1)] \otimes \begin{bmatrix} \sin(\pi x_1(\Delta\sigma + \Delta\mu + 2m\Delta\mu)) \\ \mathrm{sinc}(x_1(\Delta\mu - \Delta\sigma)) \end{bmatrix} + -$$

$$\sin[\phi(x_1)] \otimes \begin{bmatrix} \cos(\pi x_1(\Delta\sigma + \Delta\mu + 2m\Delta\mu)) \\ \mathrm{sinc}(x_1(\Delta\mu - \Delta\sigma)) \end{bmatrix} +$$

$$f_r^{(n)}(x_1) = \cos[\phi(x_1)] \otimes \begin{bmatrix} \cos(\pi x_1(\Delta\sigma + \Delta\mu + 2n\Delta\mu)) \\ \mathrm{sinc}(x_1(\Delta\mu - \Delta\sigma)) \end{bmatrix} + -$$

$$\sin[\phi(x_1)] \otimes \begin{bmatrix} \sin(\pi x_1(\Delta\sigma + \Delta\mu + 2n\Delta\mu)) \\ \mathrm{sinc}(x_1(\Delta\mu - \Delta\sigma)) \end{bmatrix}$$

$$f_r^{(m)}(x_1) = \cos[\phi(x_1)] \otimes \begin{bmatrix} \cos(\pi x_1(\Delta\sigma + \Delta\mu + 2m\Delta\mu)) \\ \mathrm{sinc}(x_1(\Delta\mu - \Delta\sigma)) \end{bmatrix} + -$$

$$\sin[\phi(x_1)] \otimes \begin{bmatrix} \sin(\pi x_1(\Delta\sigma + \Delta\mu + 2m\Delta\mu)) \\ \mathrm{sinc}(x_1(\Delta\mu - \Delta\sigma)) \end{bmatrix}$$

and thus:

$$\tan[\phi(x_1)] = \frac{f_i^{(n)}(x_1) - f_i^{(m)}(x_1)}{f_r^{(m)}(x_1) - f_r^{(n)}(x_1)} \quad (22)$$

Equations 19 and 22 should be fulfilled: the solution for the phase is both recursive and iterative. An initial guess for the phase is assumed. Then, the right wing of Eq. 19 and 22 is computed. Thus, the phase could be found from both equations. An average is computed between both solutions. This result is assumed as the next input for the right wing of both equations 19 and 22. The left wing (the phase) is computed again. The process is repeated until convergence is obtained.

It should be noted that the equivalent of Eq. 19 and 22 must be written N times, where N is the overall number of the spots in the output plane. Thus, actually this result is better expressed in a matrix representation where the elements of the matrix are all possible combinations of 1<k,n,m<N.

As indicated above, in the system 600 of FIG. 11, the diffractive optical unit 210 may be a multi-pixel diffractive optical phase mask (filter). This filter can be used for extracting the phase mask required to generate medium size array of spots. In order to expand this realization for large dimension arrays a fractal based approach should be used and an appropriate diffractive optical element is created.

The mathematical derivation described above could be used for extracting the phase mask required to generate medium size of array of spots. In order to expand this realization for large dimension arrays, a fractal based approach could be used.

Assuming that the phase mask originally generated for the multi-pixel diffractive optical phase mask element is an N×N array of spots at its Fourier plane (output plane), if the mask is expanded (scaled) by a factor of N, the N×N array will shrink by a factor of N, due to the well known Fourier relation:

$$G(\mu) = \int g(x)\exp(-2\pi i x\mu)dx \to G\left(\frac{\mu}{a}\right) = \int g(ax)\exp(-2\pi i x\mu)dx \quad (23)$$

wherein $G(\mu)$ is the Fourier Transform of $g(x)$

Thus, if a convolution between the original and the scaled array of spots is performed in the output plane (the Fourier plane) an array of $N^2$ by $N^2$ spots is to be realized due to the property of the delta function that a convolution between any function and a delta function will shift the function to the position of the delta:

$$f'(x'-x_0) = \int f(x'-x)\delta(x-x_0)dx$$

The convolution operation performed in the output plane is equivalent to a multiplication operation in the phase mask plane since a Fourier relation exists between the two planes:

if $F(\mu) = \int f(x)\exp(-2\pi i x\mu)dx$ and $G(\mu) = \int g(x)\exp(-2\pi i x\mu)dx$ then $t(x') = \int f(x)g(x'-x)dx \to T(\mu) = F(\mu)G(\mu)$ where $T(\mu) = \int t(x)\exp(-2\pi i x\mu)dx$ Multiplication of two-phase masks means addition of the two phases. Thus, the over all phase expression for the described case is $$\phi_T(x,y) = \phi(x,y) + \phi\left(\frac{x}{N}, \frac{y}{N}\right) \quad (24)$$

wherein φ is the phase of the mask that is realizing the N by N spot structure.

In the general case, equation for the phase equivalent to the fractal equations is obtained, i.e. a structure that is composed out of a summation of the scaled versions of the same structure:

$$\phi_T(x,y) = \sum_{m=1}^{M} \phi\left(\frac{x}{N^m}, \frac{y}{N^m}\right) \quad (25)$$

Figure 13A:
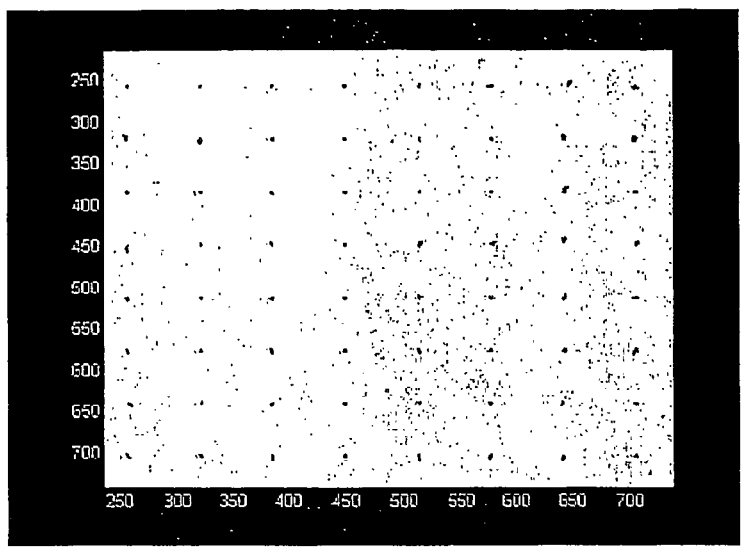
FIGS. 13A to 13C demonstrate a numerical example for the two fractal terms approach in a diffractive optical unit suitable to be used as a beam shaping arrangement in the present invention.
Figure 13B:
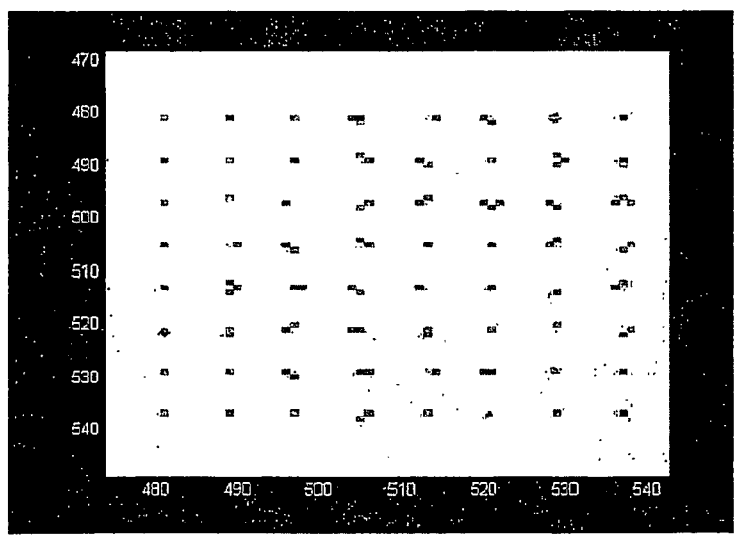
Figure 13C:
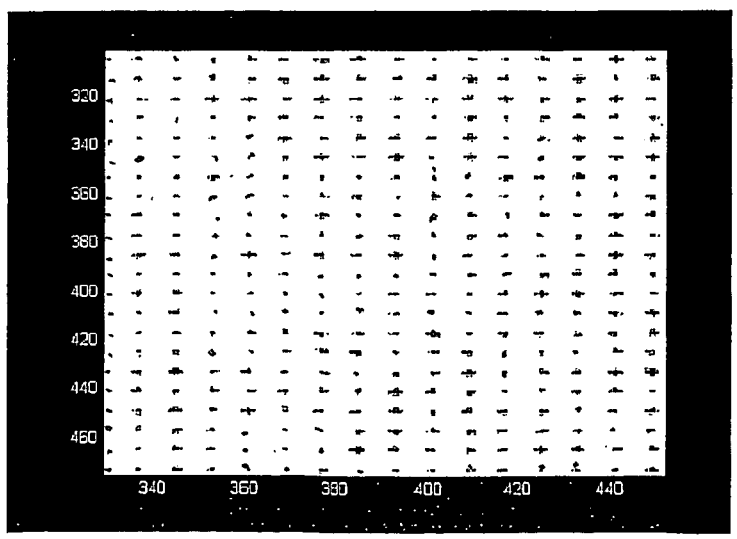

FIGS. 13A-13C demonstrate a numerical example for the described approach for two fractal terms. FIG. 13A shows an 8 by 8 two-dimensional array of spots computed using the Gerchberg-Saxton numerical algorithm. The result was obtained after 21 iterations. Scaling the phase leaded to the array of spots distribution shown in FIG. 13B. This distribution is actually a scale of the original one. Summation of the two phases (the original and the scaled one) yields the result presented on FIG. 13C, i.e. a 2D array of spots with 82 by 82 spots (i.e. 64 by 64 spots).

Figure 14:
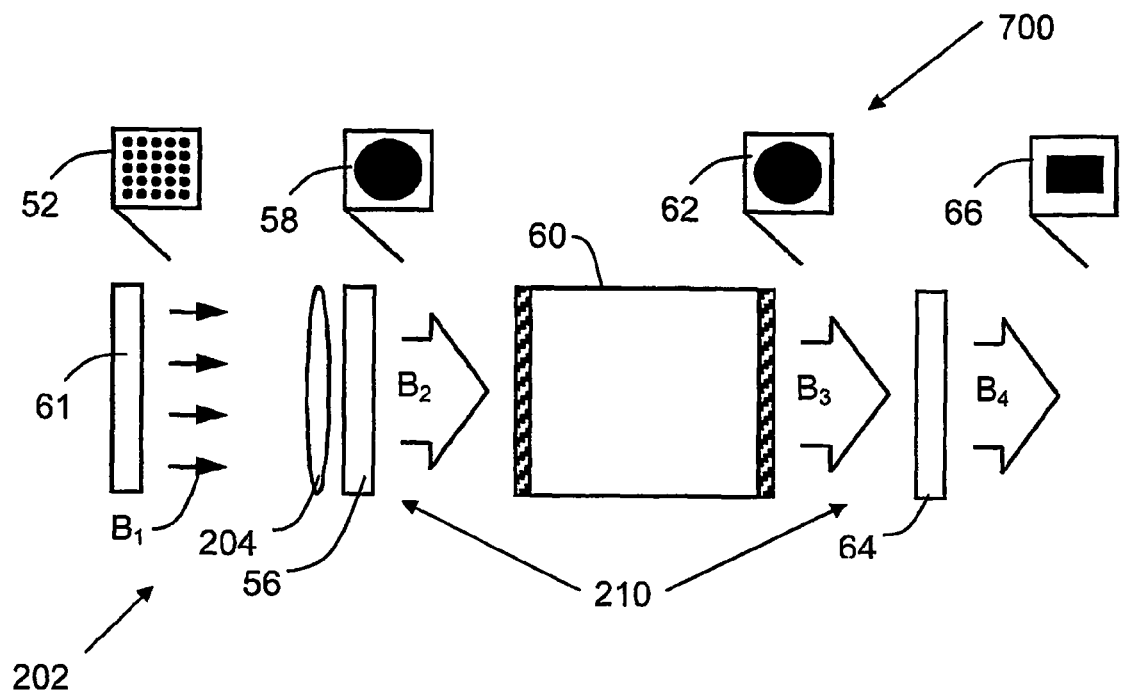
FIG. 14 schematically illustrates yet another example of an optical system of the present invention, utilizing an inverse Dammann grating assembly and a tophat element assembly.

Reference is made to FIG. 14 schematically illustrating another example of an optical system 700 of the present invention. The system 700 includes a light source system 202 formed by a laser array 61 operating in a non-visible spectral range (laser dies or VCSELs) generating a 2D array of beamlets $B_1$ (the 2D form of the beamlets is denoted 52), and a non-linear optical crystal 60; a focusing optics 204 including a collimated lens located at the output of the laser array 61; and a beam shaping arrangement 210 including an inverse Dammann grating assembly 56 located proximate to the lens 204 downstream thereof and a tophat element assembly 64 downstream of the non-linear crystal 60. Beamlets $B_1$ generated by the laser array 61 are collimated by the lens 204 and directed towards the inverse Dammann grating 56 where they are being converted into a single beam $B_2$ (corresponding spot being denoted 58) to be aimed at a lasing or doubling crystal's active aperture 60 (or any other non-linear optical medium) and being thus converted to a visible beam $B_3$ (corresponding spot being denoted 62). The visible beam $B_3$ is then directed towards another diffractive optical element (tophat) 64 where the Gaussian nature of the beam $B_3$ is turned into a unified form output beam $B_4$ to reach a total unified brightness distribution across the beam (spot denoted 66).

The so-produced unified beam $B_4$ can be used to illuminate any surface, such as an SLM, thus having a clear and unified brightness with equal light distribution across the active surface. It should be noted that although a non-linear optical crystal is used in the light source system, different variations of the architecture are possible with laser sources not requiring such a non-linear optical medium.

Figure 15:
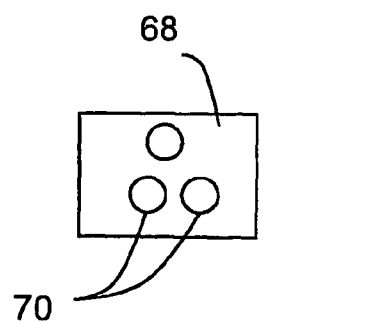
FIG. 15 exemplifies production several spots of light on a non-linear optical medium by replacing the inverse Dammann grating in FIG. 14 by a different type of optical element.

It should also be noted that although a single spot is produced on the surface of the non-linear optical crystal by using an inverse Dammann grating, several spots of light on the surface of the crystal may be produced by replacing the inverse Dammann grating by a different type of optical element (e.g., lenslet array). This is illustrated in FIG. 15: a non-linear crystal 60 is illuminated with spots of light 70, where each spot is in different location on the lasing surface, and preferably each spot turns on in different periods of time by a different set of grouped lasers (laser dies or VCSELs), thus allowing better heat dispersion over the surface of the crystal (reducing any probability to damage the coatings) and better optimization of the output optical intensity.

Figure 16A:
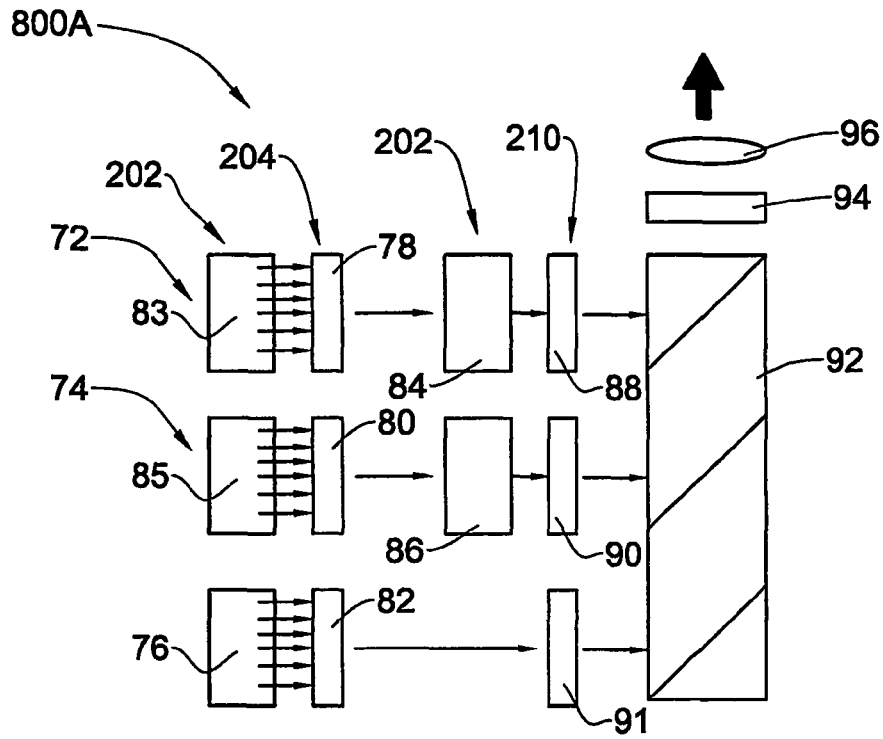
FIGS. 16A and 16B show two examples, respectively, of an optical system of the present invention configured as a projection system combining light from different light sources operating in different wavelength ranges.
Figure 16B:
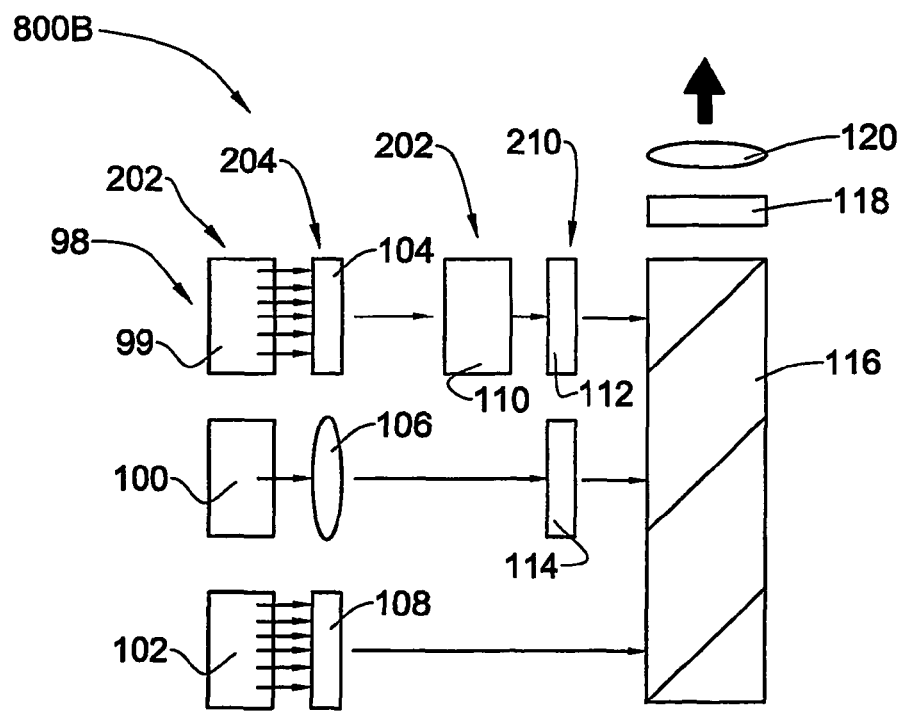

Reference is made to FIGS. 16A and 16B showing another examples of an optical system of the present invention, configured as a projection system combining light from different light sources operating in different wavelength ranges. In the example of FIG. 16A, light from two sets of 2D VCSEL sources is combined with light from a 2D laser die array source. In the example of FIG. 16B, light from one set of 2D VCSEL array is combined with light from a LED and from a set of 2D laser die array.

System 800A of FIG. 16A includes a light source system 202; a beam shaping arrangement 210; a focusing optics 204, and a light combiner 92 (periscope). The system 800A is aimed at appropriately illuminating an SLM 94, which is in turn equipped with an output imaging optics 96. In the present example, the SLM is of a light transmitting type, but it should be understood that the principles of the invention could be used with a reflective type SLM.

The light source system 202 includes light sources 72 and 74 both operating in non-visible range, and formed by 2D VCSEL arrays 83 and 85 (for example 1060 nm and 940 nm) for pumping respectively non-linear optical material 84 and 86 (e.g., KTP and BBO crystals), and a light source 76 formed by a laser die array (for example, operating with 650 nm). The three light sources define three optical paths of light propagation, respectively.

The focusing optics 204 includes a micro lenslet arrays 78, 80, 82 accommodated in three optical paths, respectively, associated with the light sources 72, 74 and 76, and are appropriately aligned with these light sources. The micro lenslet arrays 78 and 80 are located at the output of the VCSEL arrays 83 and 85 upstream of the crystals 84 and 86, respectively. Each of the micro lenslet arrays 78 and 80 is configured to focus VCSELs groups of the respective total VCSEL array so as to form a few focused spots on the respective crystal (preferably at different time sessions) as described above. The groups of spots exiting the micro-lenslet arrays 78 and 80 impinge on crystals 84 and 86 to thereby achieve a second harmonic generation effect and thus obtain green and blue light beams (in this specific example).

The micro lenslet array 82 accommodated at the output of the third light source 76 is in the form of K×L array of micro lenses arranged in accordance with the arrangement of the laser die array 76, such that a laser die elements matrix N×M is substantially identical to the lenslet matrix K×L. This is in order to unify the beamlets on the SLM active surface.

The beam shaping arrangement 210 includes multi-pixel diffractive optical phase masks 88 and 90 accommodated in the optical paths defined by the light sources 72 and 74, downstream of the non-linear crystals 84 and 86, respectively; and a multi-pixel diffractive optical phase masks 91 (e.g. tophat array) in the third optical path, at the output of the lenslet array 82.

The first and second light beams of a visible spectrum emerging from the crystals 84 and 86 pass through the multi-pixel diffractive optical phase masks 88 and 90, respectively, where they are converted to first and second arrays of N×M beams as required according to the pixel arrangement of the SLM unit 94. The beamlets from the multi-pixel phase masks 88 and 90 and from the multi-pixel diffractive optical phase masks 91 are directed towards the periscope 92, and then towards the SLM unit 94 in order to cover its active surface in an optimal manner. This light is appropriately modulated by the SLM unit (operated by driving signal) and directed towards the imaging lens 96 where it is magnified and projected outwards.

It should be noted that, although the present example show the use of a combination of two VCSEL arrays and one laser die array, all the three light sources may be laser die arrays or VCSEL arrays. It should also be noted that, although the lenslet arrays were used as light splitting units, diffractive optical elements (e.g., Dammann gratings) could be used instead (optionally together with tophat element assemblies to equally unify the output spots' brightness.

Additionally, it should be noted that the optics 204 could be removed entirely, and the non-linear material together with the necessary wavelength sensitive coating (e.g. Anti Reflective/Highly Reflective) could be affixed on top of the laser array in such a way as to be part of the laser array's resonator structure to form an extended cavity and improve the frequency doubling efficiency.

Additionally, it should be noted that, although generating a few spots on the surface of the non-linear optical crystal is preferred, a configuration where a single light spot impinges onto the crystal could be used as well. Also, at least one of the multi-pixel phase masks or all of them used to provide optimal light to the SLM can be replaced by other suitable means, such as fractal beam shaping elements, or alternatively tophat assemblies to provide a uniform intensity rectangular beam impinging on the SLM. It should also be understood that the use of non-linear material is optional, and is eliminated if a VCSEL operable in the visible spectral range is used. Although in the present example only a doubling crystal (e.g., KTP) is used, it should be understood that in some applications a lasing crystal would also be used (e.g., a light source setup including a 2D VCSEL array at 808 nm would require a lasing crystal, such as YVO4, and a KTP crystal to obtain green output at 532 nm).

In the example of FIG. 16B, a projection system 800B similarly includes a light source system 202; a beam shaping arrangement 210; a focusing optics 204, and a light combiner 116 (periscope); and is aimed at appropriately illuminating an SLM 118 (e.g., transmitting type SLM). Here, the light source system 202 includes a first light source 98 formed by a 2D VCSEL array 99 and a non-linear optical crystal 110 (e.g., KTP); a 2D laser die array 102; and a LED source 100.

The focusing optics 204 includes micro lenslet arrays 104 and 108 associated with the light sources 98 and 102, respectively, and a collection lens 106 at the output of the LED 100. Micro lens array 104 is accommodated at the output of the VCSEL array 99 upstream of the crystal 116 and is configured to focus groups of VCSELs from the total 2D VCSEL array 99 to form few focused spots on the pumped crystal 110 (preferably at different times). Micro lens array 108 is accommodated at the output of the laser die array 102 and is a K×L matrix of micro lenses arranged in accordance with a matrix of N×M laser dies, such that these matrices N×M (die) and K×L (lenslets) are substantially identical, in order to unify the beamlets on the SLM active surface.

The beam shaping arrangement 210 includes a multi-pixel diffractive optical phase mask 112 at the output of the crystal 110; and a tophat element 114 in the optical path pf light collected from the LED 100.

Thus, light from the LED 100 is collected by the collection lens 106 and then passed through the tophat 114 where the light is being reshaped from Gaussian intensity profile to that of rectangular unified beam, in order to improve light unification over the SLM surface and obtaining a unified image. Light exiting from the tophat 114 is directed towards the periscope 116. Light that exits the pumped crystal 110 passes through the multi-pixel diffractive optical phase mask 112, which is configured to convert this light into N×M beams as required according to the pixel arrangement of the SLM. These light beams from three optical paths are directed towards the periscope 116 and from there to the SLM 118. The SLM is controllable operated to modulate the incident light to form an image and to be then projected outwards by an imaging lens 120.

It should be noted that the lenslet arrays may be replaced by Dammann grating (optionally together with a tophat element assembly to equally unify the output spot brightness). Instead of generating a few spots on the surface of the crystal, the system may be configured to produce a single light spot on the crystal. Also, at least one of the multi-pixel phase masks or all of them used to provide optimal light to the SLM can be replaced by other suitable means, such as fractal beam shaping elements or alternatively tophat assemblies to provide for a uniform-intensity rectangular beam impinging on the SLM. The use of crystals (non-linear material) is eliminated if the visible-range VCSEL is used. Instead of using only a doubling crystal, a lasing crystal together with non-linear optical crystal may be used (e.g., a 2D VCSEL array at 808 nm, a lasing crystal such as YVO4, and a KTP crystal to obtain green output at 532 nm). The use of single LED may be replaced by an array of LEDs along with their required optics (lenslet array or a collimation lens), in which case the provision of tophat assembly 114 is optional. The combination of the laser die array with the VCSEL array may be replaced by two VCSEL arrays or two laser die arrays (along with the suitable beam shaping optics). Additionally, it should be noted that the optics 204 could be removed entirely, and the non-linear material together with the necessary wavelength sensitive coating (e.g. Anti Reflective/Highly Reflective) can be affixed (for example by methods listed above) on top of the laser array so as to be part of the laser array's resonator structure to form an extended cavity and improve the frequency doubling efficiency.

Figure 17A:
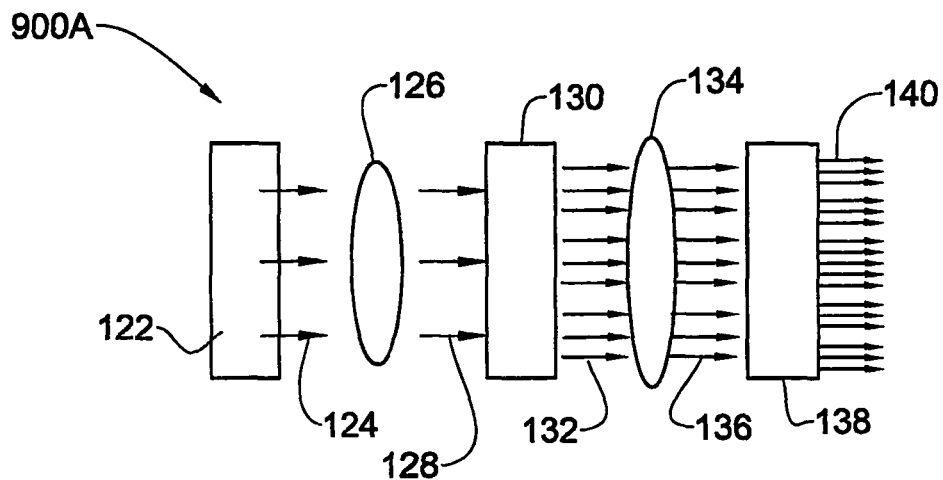
FIGS. 17A and 17B show two more examples of an optical system of the present invention suitable for use in a projection system.
Figure 17B:
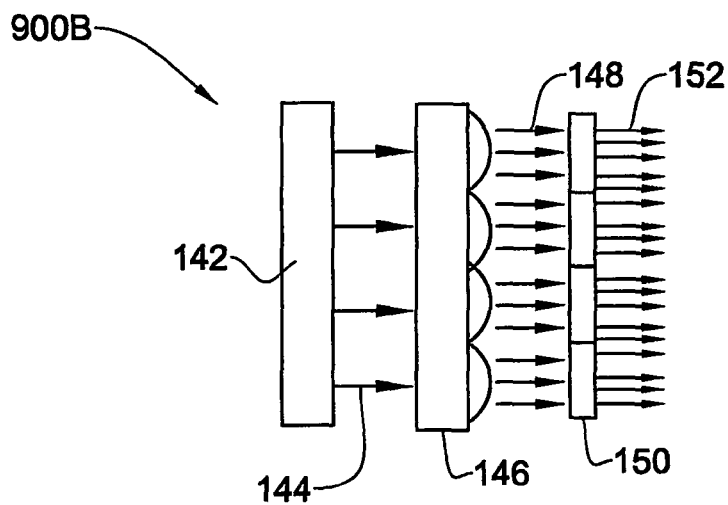

Reference is made to FIGS. 17A and 17B showing yet another examples of optical systems suitable for use in a projection system for example.

In the embodiment of FIG. 17A, an optical system 900A includes a light source system formed by a 2D VCSEL array 122; focusing optics including first and second collection lenses 126 and 134; and a beam shaping arrangement including first and second diffractive optical units 130 and 136. The VCSEL array 122 produces an array of beamlets 124 propagating towards the lens 126 (can alternatively be a plane of 2D lenslet array), which thus produces collimated beams 128 propagating towards the first beam shaper 130. The latter is a multi-pixel diffractive optical phase mask, designed to generate an output in the form of N×M beamlets. Such a mask 130 can be formed by an array of phase mask elements, where each multi-pixel phase mask element is aligned individually with a specific beamlet from the VCSEL array' beamlets. Hence, each VCSEL beamlet is transformed by its individual phase mask into an array of beamlets, meaning all the VCSEL beamlets are together transformed into a large number of output beamlets 132 by all the phase mask elements. The output characteristics of the masks 130, such as pitch and size, can be predetermined according to the requirements of a specific application. If the number of beamlets 132 in not sufficient, the second iteration can be preformed: Beams 132 are directed towards the focusing lens 134 (which can also be a 2D lenslet array) where they are collimated and projected towards the second multi-pixel phase mask 138 (which can also be an array of multi-pixel phase masks) to multiply the number of 2D beamlet array achieved by the first mask 130, thus achieving a large scale beamlets array.

A convolution is formed between the Fourier of the beam shaping elements 130 and 138 to the VCSELs set, and a distance between the beamlets spots may be set to be equal to the size of the VCSEL array.

Resulting beamlets 140 are then directed towards an illumination plane (not shown), for example, to illuminate a photo-resist for patterning it to obtain an array of optical elements, or to illuminate an SLM in a fully optimized way, where each beamlet individually impinges on a corresponding pixel in the active surface of the SLM.

It should be noted that the multi-pixel phase masks may be replaced by fractal beam shaping elements to achieve even a larger 2D beamlets array. The VCSEL array may be replaced by a laser die array.

An optical system 900B (FIG. 17B) is configured generally similar to the system of FIG. 17A, namely, includes a 2D beamlet array light source 142 (such as 2D array of VCSELs or laser dies); focusing lens arrangement; and a beam shaping arrangement. Here, however, the focusing lens arrangement is in the form of a lenslet array 146; and the beam shaping arrangement includes a single multi-pixel diffractive optical phase mask 150 formed by of an array of sub-elements (phase masks).

The light source 142 projects an array of beamlets 144 towards the lenslet array 146, where the beams are being collimated. The lenslet array 146 outputs an array of beamlets 148 towards the beam shaping element 150. The latter is configured such that each phase mask is individually aligned with a specific beamlet of the beamlet array 148, forming an array of a larger number of output beamlets 152, N×M beamlets with a specific beam size and gap between adjacent beams according to the requirements and the multi-pixel phase sub-masks design.

It should be noted that the multi-pixel phase masks may be replaced by fractal beam shaping elements to achieve even a larger 2D beamlet array. The VCSEL may be replaced by a laser die array.

Figure 18:
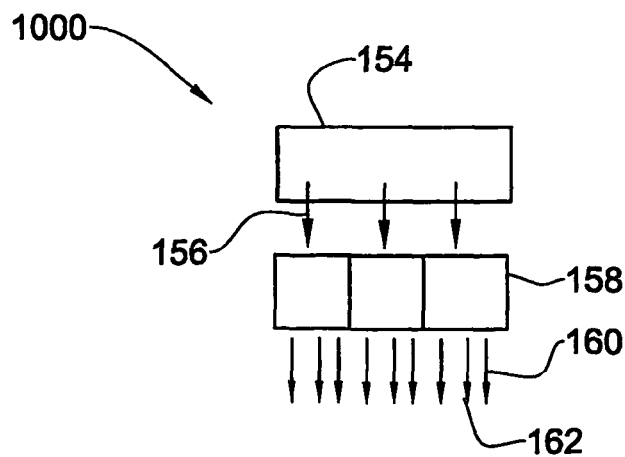
FIG. 18 exemplifies an optical system of the present invention configured for use in photolithography tools arrangement for the manufacture of micro structures, such as a micro lens array fabricated as surface relief pattern.

FIG. 18 exemplifies an optical system 1000 configured for use in photolithography for the manufacture of micro structures, such as a micro lens array fabricated as surface relief pattern. The system 1000 includes a light source system formed by a UV light source 154; and a beam shaping arrangement formed by a multi-pixel diffractive optical phase mask 158. The light source 154 is a 2D array of UV light source elements (e.g., VCSELs, laser dies) generating together a 2D array of beamlets 156. The multi-pixel diffractive optical phase mask 158 may be built out of sub-masks, mask per beamlet, as described in the previous example. The mask 158 converts the beamlets 156 to an N×M array of micro UV beams 160 with specific beam diameter and pitch size. This array of beams 160 is then projected as output illumination light. For example, beam 160 can be projected onto a photo-resist (e.g., polymer) coated substrate 162 (e.g., glass), causing the photo-resist material removal within the regions of interaction with UV light (or the opposite, in the case of a negative photo-resist). Since beams 160 present an array of spots with Gaussian distribution of light, they form a matrix-like shape on the photo-resist substrate corresponding to a lens-like shape, thus manufacturing the basic pattern for creating micro lens arrays.

It should be noted a single light source element may be used instead of an array of micro light source elements, in which case the multi-pixel diffractive optical phase mask is designed accordingly to provide a desired beamlet array arrangement. The use of the optical system 1000 provides for eliminating the need for the creation of a fabrication mask (photo tool), since the system provides the desired UV fabrication pattern, thereby reducing the fabrication cost of the micro structures.

It should also be noted that instead of using a multi-pixel phase mask, fractal beam shaping elements or Dammann elements can be used to generate the 2D beamlets array.

With regard to all the above-described examples of the invention, it should be noted that other standard optics known to the art (e.g., lens arrangement) can be added before and after the beam shaping arrangement for adjustment purposes only. Each of the light sources or light source elements can be designed using the light module architecture of FIGS. 1, 2A-2C, where several light sources are used, together with sequencing mechanism and pulse mode operation.

The use of setups of variations of VCSEL arrays, laser die arrays, and LEDs along with special beam shaping arrangement in the same projection system could potentially create great reduction in cost and physical size, higher output brightness and lower electrical power consumption.

A beam shaping technique of the present invention can be used, for example, to dramatically improve the efficiency of light impinging over the clear aperture of a spatial light modulator (SLM). The construction and operation of an SLM are known per se and therefore need not be specifically described. SLMs are commonly used nowadays as miniaturized displays (typically with a screen size of less than 1.5" diagonal) in data projectors, head mounted displays, and in the traditional viewfinders of digital cameras. Manufacturers of SLMs seek to reduce its physical size within each generation of modulators, in order to extract new varieties of products. Yet, the transmittance efficiency of an SLM remains problematic and serves as a major obstacle for further shrinking the modulators in a dramatic manner, as their inner black matrix TFT mask blocks a large portion of the incoming projected light, thus forcing the use of high brightness illumination sources, to achieve an adequate output projection image. Furthermore, the portion of light blocked by the SLM derives a requirement for an SLM with a larger surface, in order to spread the accumulated heat over the SLM, as the behavior of a Liquid Crystal substance may produce aberrations on the projected image, due to overheating. Hence, a relatively large SLM is needed to allow better light transmittance and heat dispersion.

The present invention solves the above problem by utilizing a beam shaping technique in an SLM unit. The beam shaping of the present invention is based on Dammann gratings (with or without lenslet arrays), multi-pixel diffractive optical phase mask (filter) or a fractal approach, and/or inverse Dammann gratings.

Figure 19A:
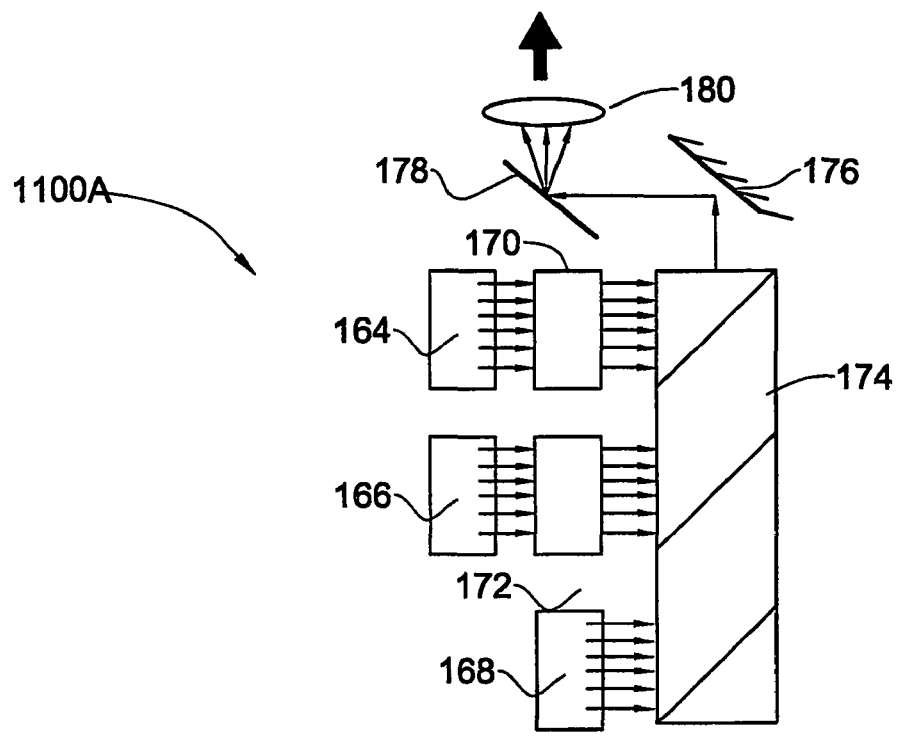
FIGS. 19A and 19B show two examples, respectively, of a full 2D addressable VCSEL pumped based architecture to obtain three color channels to achieve a colorful projected image.
Figure 19B:
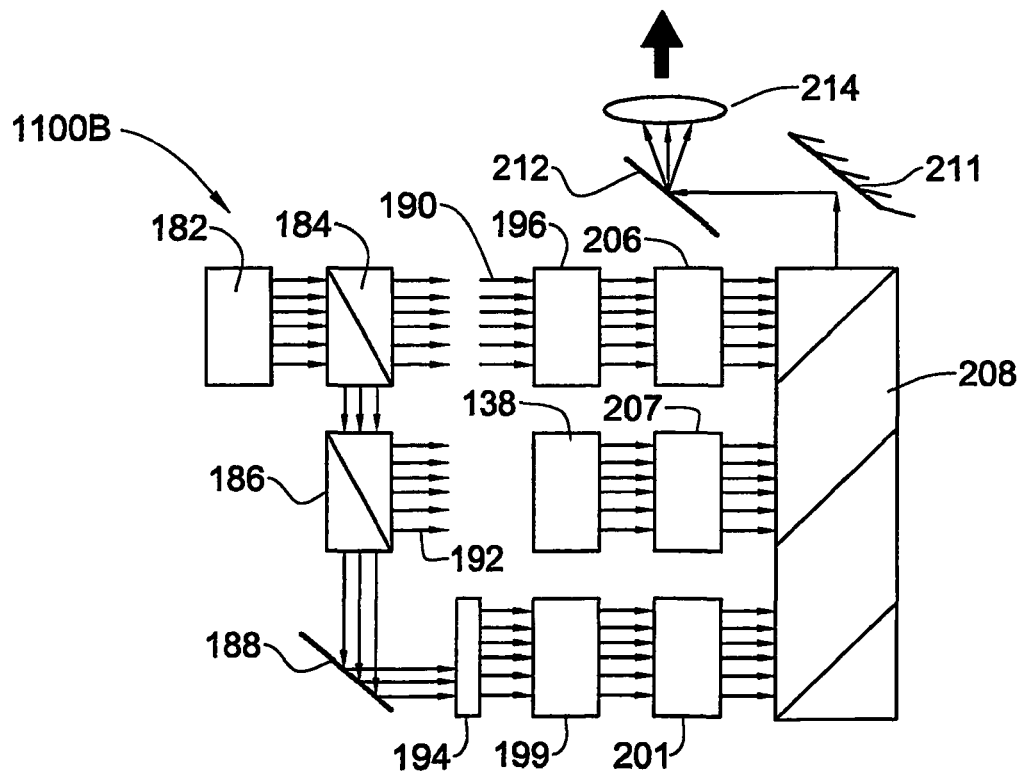

Reference is made to FIGS. 19A and 19B showing two examples, respectively, of a full 2D addressable VCSEL pumped based architecture to obtain three color channels to achieve a colorful projected image.

In the example of FIG. 19A, an optical system 1100A is configured to define three spatially separated optical paths, and direct light from all the paths towards a deflection element which scans an output image. The image is built from a set of 2D addressable channels per light source, where each light source set up is controlled to provide different patterns of gray levels and synchronically scanned by the deflection element which can be a digital micro mirror based element forming a moving square shape pattern on a projection surface with gray level changing, thus obtaining an image.

The system 1100A includes a light source system formed by three individually addressable light sources 164, 166, 168, which are 2D VCSEL arrays operating with different wavelengths. Light source 164 is a 2D VCSEL array (preferably individually addressable) at a given wavelength of 1060 nm; light source 166 is a different illumination channel based on a 2D addressable VCSEL setup array at a different given wavelength of about 860-940 nm; and light source 168 is a 2D addressable VCSEL array at a given wavelength of about 630-660 nm. Light source 168 acts as the RED light source of the system, while the other two sources 164 and 166 are utilize crystal doubling elements 170 (e.g., KTP) and 172 (e.g., BBO) to provide, respectively green and blue colors. Light source 164 illuminates doubling crystal 170 and converts the 1060 nm IR beam it originally emitted to a 530 nm green output from the KTP crystal 170. Light source 166 beams towards the doubling crystal 172 thereby converting the 860 nm IR beam from the source to 430 nm blue output from the BBO crystal 172. The beamlets sets in each of the light sources are controlled, and their brightness is determined in correspondence to the required projected image gray level per color. The IR beams consisting of the brightness pattern are projected in parallel on the doubling crystals and are interpreted into same patterns of brightness in the doubling output side but in a different wavelength within the visible range. These light source arrangements can be fabricated in similar manner as described above with reference to FIGS. 16A and 16B.

Beams emerging from crystals 170 and 172 and from the RED 2D addressable VCSEL setup 168 are all directed into a periscope 174, where they are combined, and are then directed towards a stationary mounted mirror 176, which reflects them towards a rotating mirror 178. The rotating mirror 178 carried out all the output scanning to create the entire image from numerous arrays of beamlets. The full output image is finally projected out through an imaging lens 180, the provision of which is optional.

It should be noted that other types of crystals (lasing and doubling) or other non-linear optical medium could be used to achieve the same outcome. It should also be noted that additional optical elements (for example: micro-lens array) can be used within the illumination channels. Although specific wavelengths of illumination VCSELs were presented to obtain colorful images, it should be understood that other illumination sources with different wavelengths within the non-visible range can be used as well.

In the embodiment of FIG. 19B, an optical system 1100B is configured to provide a full 2D addressable VCSEL pumped based architecture utilizing a single 2D addressable VCSEL array to obtain three color channels to achieve a colorful projected image. This 2D addressable VCSEL array 182 is an IR light source at a given wavelength of 808 nm. Light produced by the light source 182 is split into three spatially separated beams by beam splitters 184 and 186. As shown, a light portion reflected by the beam splitter 184 is directed to the beam splitter 186 to be further split into two light portions, one of which is transmitted by the beam splitter 186 towards a mirror 188 appropriately oriented to direct this light portions parallel to the light portions that were, respectively, transmitted by beam splitter 184 and reflected by beams splitter 186.

Light portions emerging from the beam splitters 184 and 186, and the light portion reflected by mirror 188 are directed to liquid crystal cells 190, 192 and 194, respectively. Each liquid crystal cell can be controlled to allow each projection channel to be operated or to be turned off (to allow color sequential operation).

Light portions emerging from the liquid crystal cells 190, 192, 194 propagate toward, respectively, lasing crystals 196, 198 and 199, where the wavelength per channel is converted from 808 nm to a different wavelength range. Light output form the LC 190 passes through the lasing crystal 196 (e.g., Nd:YVO4) to be converted to 1064 nm light, and is then passed through a doubling crystal 206 (e.g., KTP) where second harmonic generation of light is formed and thus a visible-range beam of 532 nm (green) is produced.

A similar process takes place in the illumination channel associated with the beam splitter 186. Light emerging from the LC cell 192 hits a lasing crystal 198 (e.g., Nd:YVO4) which converts the 808 nm input to 914 nm, and is then aimed at a doubling crystal 207 (e.g., BBO) which emits a second harmonic generation of the input, thus achieving 457 nm output (Blue).

At the third channel associated with the beam splitter 188, light output from the LC 194 is directed towards a lasing crystal 199 (e.g., Nd:Yag) which emits 1319 nm light and is then directed towards a doubling crystal 201 to obtain a second harmonic generation in its output, thus achieving a 660 nm output (Red).

All the channels are lit in different timings in color sequential mode, where at each illumination cycle a different pattern is lit on the 808 nm VCSEL array. The light beams are beamed towards each channel in a parallel manner, but the patterns of illumination cycle are forwarded only to the channel of the corresponding color, and are blocked by the liquid crystals in the other channels.

Light generated in each one of the channels is directed outwards as visible range pattern and projected towards a periscope 208, where the light from all the channels is pointed towards a mirror 211 and then towards a deflection mirror 212. The latter carried out all the output scanning to create the entire image from numerous arrays of beamlet patterns. The full output image is finally projected out through an imaging lens 214 (optionally). It should be noted that alternatively the beam splitter and Liquid Crystal shutter combination can be replaced by a deflector mirror to control which path receives illumination at what point in time.

At each given cycle, a control unit (not shown) carefully adjusts the gray level of the 2D VCSEL array according to the inserted image feed per color, and is scanned by the deflector outwards to obtain a large image out of a relatively small array of 2D VCSELs.

It should be noted that other types of crystals (lasing and doubling) may be used to achieve the same outcome. Additional optical elements (e.g., micro-lens array) can be added within the illumination channels. Instead of splitting the 808 nm VCSEL array into three channels, three 808 nm VCSEL arrays can be used, each in a different channel, eliminating the need for beam splitters and liquid crystals. Alternatively, a larger 808 nm 2D addressable VCSEL array can be used to cover all three channels (instead of three VCSEL arrays) and illuminate each channel by controlling the VCSEL array address lines. It should also be noted that although specific wavelengths of illumination were exemplified to obtain colorful images, other illumination sources with different wavelengths within the non-visible range can be used. It should be noted that this light source structure coupled with the proper beam shaping arrangement can also be used to illuminate an SLM based projection system such as described above with reference to FIGS. 16A and 16B.

Those skilled in the art will readily appreciate that various modifications and changes can be applied to the embodiments of the invention as hereinbefore described without departing from its scope defined in and by the appended claims.

The invention claimed is:

1. An optical system configured to provide a desired illuminating light pattern, the system comprising a light source system configured and operable to produce structured light in the form of a plurality of spatially separated light beams; and a beam shaping arrangement; the beam shaping arrangement being configured as a diffractive optical unit comprising at least one inverse Dammann grating configured and operable for combining an array of the spatially separated light beams into a single light beam thereby significantly increasing intensity of the illuminating light.

2. The system of claim 1, wherein said diffractive optical unit comprises a tophat element assembly configured and operable for affecting intensity profile of the light beam to provide the illuminating light of a substantially rectangular uniform intensity profile.

3. The system of claim 2, wherein said tophat element assembly comprises an array of tophat elements arranged in accordance with an array of the spatially separated light beams, such that each of the tophat elements affects the corresponding one of the light beams.

4. The system of claim 3, wherein the tophat element is configured to affect the intensity profile of the corresponding light beam to produce therefrom an illuminating light beam of the substantially rectangular intensity profile corresponding to a geometry of the entire surface to be illuminated.

5. The system of claim 3, wherein the tophat element is configured to affect the intensity profile of the corresponding light beam to produce therefrom an illuminating light beam of the substantially rectangular intensity profile corresponding to a geometry of a single pixel from an array of pixels in a surface to be illuminated.

6. The system of claim 3, wherein the tophat element is configured to affect the intensity profile of the corresponding light beam to produce therefrom an illuminating light beam of the substantially rectangular intensity profile corresponding to a geometry of a sub-array from an array of pixels in a surface to be illuminated.

7. The system of claim 1, wherein said light source system comprises a plurality of light source elements each producing the corresponding one of said light beams.

8. The system of claim 1, wherein said light source system comprises at least one light source element generating at least one light beam; and a light splitting unit for splitting the at least one light beam into an array of the spatially separated light beams.

9. The system of claim 1, comprising a focusing optics comprising a lens accommodated in optical paths of an array of the light beams to direct them along an optical axis of the lens.

10. The system of claim 1, comprising a focusing optics comprising an array of lenses each in an optical path of the corresponding one of an array of the light beams.

11. The system of claim 1, wherein said light source system comprises at least one pumping light source arrangement and at least one non-linear optical medium to be pumped by light generated by said at least one pumping light source arrangement.

12. The system of claim 11, wherein the pumping light source arrangement comprises a surface emitting laser source for directly pumping the non-linear optical medium.

13. The system of claim 11, wherein the pumping light source arrangement comprises a surface emitting laser source and a lasing crystal.

14. The system of claim 11, wherein said at least one pumping light source arrangement comprises an array of surface emitting laser source elements.

15. The system of claim 11, wherein said at least one pumping light source arrangement comprises an array of Vertical Cavity Surface Emitting Lasers (VCSELs).

16. The system of claim 1, wherein said light source system comprises at least one light source element, said light source element being at least one of the following: light emitting diode (LED), laser die, Edge Emitting Laser, Surface Emitting Laser.

17. The system of claim 8, wherein said light splitting unit comprises at least one multi-pixel diffractive optical phase mask, the mask being configured to produce from said at least one light beam an array of the spatially separated light beams.

18. The system of claim 8, wherein said light splitting unit comprises a multi-pixel diffractive optical phase mask defining a first array of pixels, each of said pixels being configured as a second array of sub-pixels, thereby producing the spatially separated light beams arranged in accordance with said second array.

19. The system of claim 8, wherein said light splitting unit comprises at least first and second multi-pixel diffractive optical phase masks accommodated in a spaced-apart relationship along an optical path of light propagation through the system, and defining different arrays of pixels, respectively, such that light passage through the first mask produces a first array of spatially separated light beams, and passage of said first array through the second mask produces a second array of an increased number of spatially separated light beams.

20. The system of claim 8, wherein said light splitting unit comprises a Dammann grating assembly configured to produce from said at least one light beam an array of the spatially separated light beams.

21. The system of claim 17, wherein said beam shaping arrangement comprises an array of tophat elements, each in the optical path of the corresponding one of the spatially separated light beams to produce therefrom a light beam of substantially rectangular and uniform intensity profile.

22. The system of claim 8, wherein said light splitting unit comprises an array of Dammann grating assemblies arranged in a cascaded manner, such that each light beam output from one Dammann grating assembly is directed through a successive Dammann grating assembly, thereby multiplying a number of the light beams produced by said one Dammann grating assembly.

23. The system of claim 14, wherein the beam shaping arrangement comprises an inverse Dammann grating assembly for combining an array of the spatially separated light beams into the single combined light beam of significantly higher intensity value.

24. The system of claim 23, wherein said inverse Dammann grating assembly is accommodated upstream of the non-linear optical medium with respect to a direction of light propagation through the optical system.

25. The system of claim 23, wherein the beam shaping arrangement comprises a tophat element accommodated in an optical path of the combined light beam to produce the illuminating light beam of the substantially rectangular uniform intensity profile.

26. The system of claim 14, wherein the beam shaping arrangement comprises an array of tophat elements accommodated at the output of the non-linear medium.

27. The system of claim 14, comprising a multi-pixel diffractive optical phase mask accommodated in optical path of light output from the non-linear optical medium to produce an array of the spatially separated light beams, and an array of tophat elements accommodated in optical path of said array of the spatially separated light beams.

28. The system of claim 1, comprising a control unit associated with the light source system, said control unit being preprogrammed to carry out a sequencing mechanism to thereby sequentially actuate a plurality of light source elements in accordance with a predetermined pattern.

29. The system of claim 28, wherein said pattern is such that at any given time only one light source element is operative, and the entire light source system being seen to a human eye as constantly operative for a required operation time, thereby reducing over heating in a single area defined by the light source system.

30. The system of claim 29, wherein said pattern is such that at any given moment of time the most distant light source element is operative relative to the light source element that was operative before it.

31. The system of claim 28, wherein said pattern is such that at any given time only one group of light source elements is operative.

32. The system of claim 14, comprising a control unit associated with the light source system, said control unit being preprogrammed to carry out a sequencing mechanism to thereby sequentially actuate the plurality of the light source elements in accordance with a predetermined pattern.

33. The system of claim 32, wherein said pattern is such that at any given time only one group of light source elements is operative.

34. The system of claim 1, wherein said light source system is configured to define at least two spatially separated optical paths, the light source system comprising at least two light sources operating in different wavelength ranges.

35. The system of claim 34, wherein at least one of said light sources comprises a pumping light source arrangement and a non-linear optical medium.

36. The system of claim 34, wherein the beam shaping arrangement comprises a tophat element assembly accommodated in one of the optical paths to allow passage of the spatially separated light beams therethrough and thereby produce output light beams of the substantially rectangular uniform intensity profile; and a light combining unit for combining light from said at least two optical paths to propagate along a common optical path.

37. The system of claim 36, comprising a Spatial Light Modulator (SLM) accommodated in said common optical path.

38. The system of claim 37, wherein the spatially separated light beams are arranged in a predetermined array corresponding to a pixel array arrangement of the SLM.

39. The system of claim 37, wherein the tophat element assembly comprises an array of tophat elements each associated with a corresponding one of the light beams.

40. The system of claim 35, wherein the beam shaping arrangement comprising at least one light splitting unit accommodated at the output of said at least one non-linear optical medium, respectively, and configured for splitting light emerging from the non-linear optical medium into a predetermined array of the spatially separated light beams for propagating along the respective at least one optical path; and comprising at least one tophat element assembly accommodated in at least one of said optical paths to allow passage of the spatially separated light beams therethrough and thereby produce output light beams of a substantially rectangular uniform intensity profile; and a light combining unit for combining light from said at least two optical paths to propagate along a common optical path.

41. The system of claim 40, wherein the array of tophat elements is accommodated in the optical path associated with the at least one other light source.

42. The system of claim 35, wherein said at least one pumping light source arrangement comprises a certain number of Surface Emitting Lasers, and said at least one other light source comprises a certain number of laser dies.

43. The system of claim 42, wherein the light source system comprises first and second Surface Emitting Laser arrays producing light of different wavelengths, respectively, and operating as first and second pumping sources for the first and second non-linear optical media; and comprises the laser die array operating with a third different wavelength.

44. The system of claim 43, wherein the first and second Surface Emitting Laser arrays operate in a non-visible spectral range, light emerging from the first and second non-linear optical media being of two different colors, respectively, of a visible spectral range.

45. The system of claim 44, wherein the first and second Surface Emitting Laser arrays are Vertical Cavity Surface Emitting Laser (VCSEL) arrays; the first and second non-linear optical media are KTP and BBO crystals.

46. The system of claim 34, comprising at least two focusing optics arrangement accommodated in said at least two optical paths.

47. The system of claim 40, wherein the light source system comprises first and second Surface Emitting Laser arrays producing light of different wavelengths, respectively, and operating as first and second pumping sources for the first and second non-linear optical media; and the laser die array operating with a third different wavelength, the light splitting units being accommodated in first and second optical paths associated with the first and second Surface Emitting Laser arrays, and the tophat element assembly being accommodated in the optical path associated with the die array.

48. The system of claim 34, wherein the light source system is configured to define three spatially separated optical paths associated, respectively, with the first light source including an array of Surface Emitting Lasers and producing an array of spatially separated light beams; the second light source including a light emitting diode (LED); and the third light source formed by an array of laser dies.

49. The system of claim 48, wherein the first light source includes a non-linear optical medium to be pumped by the Surface Emitting Laser Array.

50. The system of claim 49, comprising a light splitting unit accommodated at the output of the non-linear optical medium to split light emerging therefrom into an of the spatially separated light beams.

51. The system of claim 48, comprising two focusing optics arrangement accommodated in the optical paths defined by the Surface Emitting Laser array and laser dies array, respectively; and light collection optics accommodated in the optical path defined by the LED.

52. The system of claim 48, wherein the beam shaping arrangement comprises a tophat element accommodated in the second optical path to produce from a light beam generated by the LED a light beam of a substantially rectangular uniform intensity profile; and a light combining unit for combining light from said three optical paths to propagate along a common optical path.

53. The system of claim 50, wherein the beam shaping arrangement comprises a tophat element accommodated in the second optical path to produce from a light beam generated by the LED a light beam of a substantially rectangular uniform intensity profile; and a light combining unit for combining light from said three optical paths to propagate along a common optical path.

54. The system of claim 48, comprising a Spatial Light Modulator (SLM) accommodated in said common optical path.

55. The system of claim 54, wherein the array of the spatially separated light beams produced by the light source corresponds to a pixel array arrangement of the SLM.

56. The system of claim 53, wherein the tophat element assembly comprises an array of tophat elements each associated with a corresponding one of the light beams.

57. The system of claim 1, comprising at least one multi-pixel diffractive optical phase mask configured to produce said structure light in the form of a predetermined pattern of spatially separated light beams.

58. The system of claim 57, wherein the multi-pixel diffractive optical phase mask is configured to define a first array of pixels, each of said pixels being configured to define a second array of sub-pixels.

59. The system of claim 57, wherein the beam shaping arrangement comprises at least first and second multi-pixel diffractive optical phase mask accommodated in a spaced-apart relationship along an optical path of light propagation through the system, such that the light beam emerging from the first mask is further split into an array of light beams by the second mask.

60. The system of claim 57, comprising a focusing optics accommodated in an optical path of light propagating towards said at least one multi-pixel diffractive optical phase mask.

61. The system of claim 59, comprising a focusing optics including at least two focusing assemblies accommodated upstream of said at least two multi-pixel diffractive optical phase masks, respectively.

62. The system of claim 60, wherein the focusing optics comprises an array of lenses arranged in a plane perpendicular to an optical axes of the lenses, thereby producing a corresponding array of focused light beams propagating towards the multi-pixel diffractive optical phase mask.

63. The system of claim 62, wherein the multi-pixel diffractive optical phase mask comprises an array of phase masks arranged in a plane parallel to the lenses arrangement, said array of the phase masks being configured such that each of the phase masks is aligned with a corresponding one of the focused light beams, thus forming an array of light beams of a predetermined size and gap between the adjacent beams.

64. An optical system configured to provide a desired illuminating light pattern, the system comprising a light source system configured and operable to produce structured light in the form of a plurality of spatially separated light beams; and a beam shaping arrangement comprising; the beam shaping arrangement being configured as a diffractive optical unit comprising an inverse Dammann grating assembly configured and operable to combine an array of the spatially separated light beams into a single light beam thereby significantly increasing intensity of the illuminating light.

65. The system of claim 64, wherein said diffractive optical unit is configured to affect the intensity profile of the beam to produce therefrom a light beam of a substantially rectangular uniform intensity profile.

66. The system of claim 65, wherein said diffractive optical unit comprises a tophat element assembly.

67. The system of claim 64, wherein the diffractive optical unit comprises a tophat element assembly to affect the intensity profile of the light beam to produce therefrom a light beam of a substantially rectangular uniform intensity profile.

68. The system of claim 67, wherein said tophat element assembly is accommodated at the output of the inverse Dammann grating.

69. An optical system configured to provide a desired illuminating light pattern, the system comprising a light source system configured and operable to produce structured light in the form of a plurality of spatially separated light beams; and a beam shaping arrangement comprising; the beam shaping arrangement comprising an inverse Dammann grating assembly configured and operable to combine said plurality thereby significantly increasing intensity of the illuminating light.

70. A method for producing illuminating light of a desired pattern, the method comprising producing structured light in the form of a plurality of spatially separated light beams; and applying beam shaping to the structure light, said beam shaping comprising passing the structured light through a diffractive optical unit comprising an inverse Dammann grating thereby combining multiple light beams into a single light beam thereby significantly increasing intensity of the illuminating light.

71. The method of claim 70, wherein said beam shaping comprises passing the input light through a tophat element assembly, thereby affecting the intensity profile of input light to provide the illuminating light in the form of an array of light beams of a substantially rectangular uniform intensity profile.

72. The method of claim 71, wherein said tophat element assembly comprises an array of tophat elements arranged in accordance with an array of the spatially separated light beams, such that each of the tophat elements affects the corresponding one of the light beams.

73. The method of claim 72, wherein the tophat element is configured to affect the intensity profile of the corresponding light beam to produce therefrom the illuminating light beam of the substantially rectangular intensity profile corresponding to a geometry of the entire surface to be illuminated.

74. The method of claim 72, wherein the tophat element is configured to affect the intensity profile of the corresponding light beam to produce therefrom the illuminating light beam of the substantially rectangular intensity profile corresponding to a geometry of a single pixel from an array of pixels in a surface to be illuminated.

75. The method of claim 72, wherein the tophat element is configured to affect the intensity profile of the corresponding light beam to produce therefrom the illuminating light beam of the substantially rectangular intensity profile corresponding to a geometry of a sub-array from an array of pixels in a surface to be illuminated.

76. An optical system configured to provide a desired illuminating light pattern, the system comprising a light source system comprising at least one light source element generating at least one light beam, and a light splitting unit for splitting the at least one light beam into an array of spatially separated light beams; and a beam shaping arrangement; the beam shaping arrangement being configured as a diffractive optical unit configured and operable to carry out at least one of the following: (i) combining an array of the spatially separated light beams into a single light beam thereby significantly increasing intensity of the illuminating light; (ii) affecting intensity profile of the light beam to provide the illuminating light of a substantially rectangular uniform intensity profile.

77. The system of claim 76, wherein said diffractive optical unit comprises at least one inverse Dammann grating.

78. An optical system configured to provide a desired illuminating light pattern, the system comprising a light source system configured and operable to produce structured light in the form of a plurality of spatially separated light beams, said light source system comprising at least one pumping light source arrangement and at least one non-linear optical medium to be pumped by light generated by said at least one pumping light source arrangement; and a beam shaping arrangement; the beam shaping arrangement being configured as a diffractive optical unit configured and operable to carry out at least one of the following: (i) combining an array of the spatially separated light beams into a single light beam thereby significantly increasing intensity of the illuminating light; (ii) affecting intensity profile of the light beam to provide the illuminating light of a substantially rectangular uniform intensity profile.

79. An optical system configured to provide a desired illuminating light pattern, the system comprising:
 a light source system configured and operable to produce structured light in the form of a plurality of spatially separated light beams; and a beam shaping arrangement;
 the beam shaping arrangement being configured as a diffractive optical unit configured and operable to carry out at least one of the following: (i) combining an array of the spatially separated light beams into a single light beam thereby significantly increasing intensity of the illuminating light; (ii) affecting intensity profile of the light beam to provide the illuminating light of a substantially rectangular uniform intensity profile; and
 a control unit associated with the light source system, said control unit being preprogrammed to carry out a sequencing mechanism to thereby sequentially actuate a plurality of light source elements in accordance with a predetermined pattern.

80. An optical system configured to provide a desired illuminating light pattern, the system comprising: a light source system comprising at least one multi-pixel diffractive optical phase mask configured and operable to produce structured light in the form of a predetermined pattern of spatially separated light beams; and a beam shaping arrangement; the beam shaping arrangement being configured as a diffractive optical unit configured and operable to carry out at least one of the following: (i) combining an array of the spatially separated light beams into a single light beam thereby significantly increasing intensity of the illuminating light; (ii) affecting intensity profile of the light beam to provide the illuminating light of a substantially rectangular uniform intensity profile.

* * * * *